(12) United States Patent
Thompson et al.

(10) Patent No.: US 6,664,634 B2
(45) Date of Patent: Dec. 16, 2003

(54) METAL WIRING PATTERN FOR MEMORY DEVICES

(75) Inventors: J. Wayne Thompson, Boise, ID (US); Todd A. Merritt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 140 days.

(21) Appl. No.: 09/805,913

(22) Filed: Mar. 15, 2001

(65) Prior Publication Data

US 2002/0131289 A1 Sep. 19, 2002

(51) Int. Cl.[7] ............................................. H01L 23/48
(52) U.S. Cl. ...................... 257/758; 257/208; 257/211; 438/622
(58) Field of Search ............................... 257/208, 211, 257/758; 438/622

(56) References Cited

U.S. PATENT DOCUMENTS

| | | | |
|---|---|---|---|
| 4,295,149 A | | 10/1981 | Balyoz et al. |
| 5,459,093 A | * | 10/1995 | Kuroda et al. ............... 438/599 |
| 5,751,031 A | | 5/1998 | Thompson et al. |
| 6,184,122 B1 | * | 2/2001 | Fu et al. ...................... 438/622 |
| 6,314,011 B1 | * | 11/2001 | Keeth et al. ................... 365/51 |
| 6,445,065 B1 | * | 9/2002 | Gheewala et al. ........... 257/691 |
| 2002/0011610 A1 | * | 1/2002 | Ishimaru et al. ............ 257/208 |

* cited by examiner

Primary Examiner—Richard Elms
Assistant Examiner—Christian D. Wilson
(74) Attorney, Agent, or Firm—Dickstein Shapiro Morin & Oshinsky LLP

(57) ABSTRACT

A memory integrated circuit having three layers of metallic traces disposed over a substrate assembly including various active devices. The traces are arranged to include I/O traces that are continuous in the third layer across spans of 4 or 8 memory blocks of an array, and that are interspersed on the third layer with non-I/O lines adapted to reduce interference between I/O lines. Column select lines, orthogonal to I/O lines and disposed in the third layer of metallic traces, except in the vicinity of I/O lines, are provided in a linear configuration and shielded from parallel digit lines in the first layer of traces by traces of the intervening second layer of traces. Global bleeder lines disposed in the third layer of traces are adapted to apply a standby voltage to a plurality of sense amplifiers. Other features of the invention include two layer power and ground bus traces, and row decoder and phase driver circuits disposed in throat and gap cell regions respectively.

19 Claims, 22 Drawing Sheets

METAL WIRING PATTERN FOR MEMORY DEVICES

FIELD OF THE INVENTION

The present invention relates to an improved integrated circuit chip, and more specifically to the metalization patterns of a dynamic random access memory device.

BACKGROUND OF THE INVENTION

High component density and rapid signal transmission are both desirable in an integrated circuit memory device. As circuit density rises however, the conductive traces used to interconnect components must be made finer and placed closer together. Unfortunately, making traces finer and placing them closer together makes them less amenable to rapid signal transmission.

Reducing the cross-section of a given conductor increases its resistance, and consequently its RC time constant. A higher RC time constant is reflected in lower signal transmission speed. Placing traces closer together increases the probability of crosstalk. This also effectively reduces the capacity of a line to transmit signals rapidly. There is thus a need to provide novel interconnect structures that allow rapid signal transmission across high-density integrated circuits.

Different methods of forming conductors on integrated circuit memory devices are known in the art. In conventional practice, conductors have been implemented as buried polysilicon traces. These are formed by patterned doping of a semiconductor substrate. The resistance and capacitance of such traces are high, as compared with traces formed by other means.

It is also known to form metallic interconnects by depositing a layer of metal over a substrate and selectively etching the layer to form a conductor pattern.

The deposition of metal traces over a substrate assembly may also be accomplished by use of a damascene process. In the damascene process metal lines are deposited in grooves etched into a dielectric layer such as a substrate assembly, or insulating layer. Excess metal is then removed by chemical mechanical planarization (CMP). Once the excess metal has been removed only the metal that was deposited down within the grooves remains. This metal forms the interconnecting traces between devices.

Depending on the configuration of the traces, the resistance and capacitance of buried polysilicon lines, or metal traces formed by various methods, tends to limit signal transmission speed. Signal crosstalk between conductors remains a problem. Accordingly, there is a need for new conductor structures and arrangements that improve signal transmission speed in the face of increasing component density.

SUMMARY OF THE INVENTION

The present invention addresses the need for reduced capacitance and increased trace conductivity in the metalization layers of integrated circuit devices, for example dynamic random access memory devices. The integrated circuit includes three layer metalization and various features, and trace layouts, offering improved system performance.

In one aspect of the present invention, the use of buried polysilicon conductors as circuit traces is supplemented by three layers of metal traces deposited in layers above a substrate assembly and separated by layers of insulation. The substrate assembly includes doped active regions, and polysilicon plugs. By reducing the number of buried polysilicon conductor lines, and replacing them with metal traces, the integrated circuit reduces the trace resistance and capacitance of key traces. This increases the signal response speed for the circuit.

In one aspect of the invention, I/O lines of an integrated circuit memory device are provided in a third layer of metalization. The lines cross four or eight memory blocks of an array in uninterrupted fashion from their respective points of origin to their respective points of termination.

In another aspect of the present invention, column select lines of an integrated circuit memory device are disposed in a third layer of metalization above a memory array and in a second layer of metalization for a short span in the vicinity of an I/O line.

In another aspect of the invention, discrete I/O lines of an integrated circuit memory device are separated from one another by interspersed control lines. The interspersed lines are selected such that signal transitions during operation of the memory device take place on the I/O lines out of phase with signal transitions taking place on the interspersed control lines. Consequently at the time of signal transitions of the I/O lines, known as column time, the interspersed control lines appear to be static. The static lines shield the I/O lines, that they separate from one another. They thus prevent capacitive interference between I/O lines during I/O line transitions. Likewise, the I/O lines are stable during transitions of the interspersed control lines, at row time. The result is that the I/O lines serve to shield the control lines from transients present on other control lines or non-I/O lines respectively.

In another aspect of the invention, a low-impedance power bus for an integrated circuit memory device is provided by disposing power traces on substantially parallel regions of metalization in adjacent layers of metalization, and joining these regions with a plurality of conductive vias to form a power bus sandwich.

In another aspect of the invention, a ground bus sandwich for an integrated circuit memory device is provided by disposing ground conductors, connected by a plurality of vias, in substantially parallel spaced relation, on two adjacent layers of metalization.

In yet another aspect of the invention, the allocation of circuit traces in an integrated circuit memory device to a third layer of metalization allows for the provision of low trace density on the third layer. This low trace density permits greater spacing between traces, and accordingly thicker traces, since the aspect ratio of traces and the spaces therebetween is limited by the limitations of parallax and anisotropic etch processes. Accordingly, third layer traces may be formed that are both less resistive than first and second layer traces, because of increased cross section, and having less capacitive interaction with the underlying substrate assembly of the circuit. This results in third layer conductive traces with a reduced RC product, thus characterized by reduced signal propagation times.

In yet another aspect, the invention includes a column select line of an integrated circuit memory device that, in the vicinity of a sense amplifier, is routed through a second metal layer, rather than a first metal layer, thereby allowing a substantially larger trace cross section. Consequently, the resistance of the trace is reduced, as are signal transmission times.

In yet another aspect of the invention, column select lines of an integrated circuit memory device are disposed in a third layer of metalization substantially parallel to digit lines disposed in a first layer of metalization. A plurality of other metal traces are disposed in an intervening second layer of metalization with an orientation substantially perpendicular to both the digit lines below and the column lines above. As a result the digit lines are shielded by the intervening metal traces in the second layer of metalization from capacitive interference originating with signal transitions taking place on the column select lines in the third layer of metalization. It was previously necessary to arrange the column select lines in a serpentine configuration that crossed all digit lines. This promoted equal coupling between the column select line and all digit lines, thereby avoiding imbalance between digit lines. Now, however, it is possible to run a column select line in metal-3 linearly in parallel with digit lines. The result is a more direct, and hence a shorter, column select line path with resultant reduced capacitance and resistance, and increased signal transmission speed.

In yet another aspect of the invention, the main power bus for an integrated circuit memory device is run, in continuous fashion on the second metal layer, through the wordline driver and gap cell regions of the integrated circuit.

In yet another aspect of the invention, LT lines of an integrated circuit memory device are arranged so as to occupy, in different regions, three layers of metalization. An LT line is a global word line that spans an array, and is adapted to convey a decoded address signal to a wordline driver.

In yet another aspect of the invention, a bleeder line of an integrated circuit memory device is disposed across the expanse of the device in such a way as to allow the sharing of a bleeder circuit between two adjacent memory cell arrays, with resulting savings in circuitry, and increased density.

These and other features, and advantages, of the present invention will become apparent to those of skill in the art from the following drawings and description which illustrate various aspects of the invention.

The features outlined above should be construed to be merely illustrative of some of the more prominent aspects and applications of the invention. Many other beneficial results can be attained by applying the disclosed invention in a different manner or modifying the invention as will be described. Accordingly, other advantages and features and a fuller understanding of the invention may be had by referring to the following detailed description of the preferred embodiments.

DETAILED DESCRIPTION OF THE INVENTION.

Figure 1A:
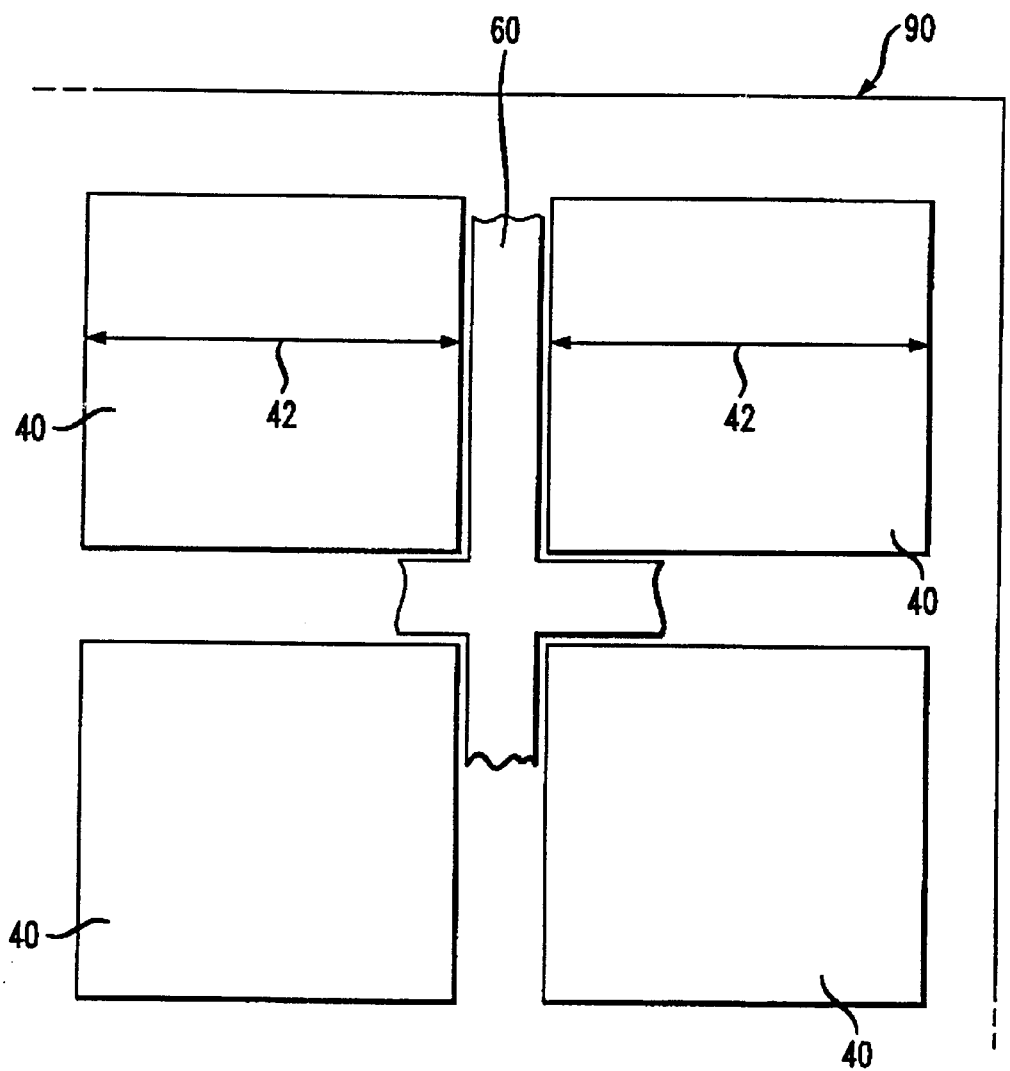
FIG. 1A shows a layout of an integrated circuit memory device of the present invention in plan view, including memory arrays and peripheral circuitry.
Figure 1B:
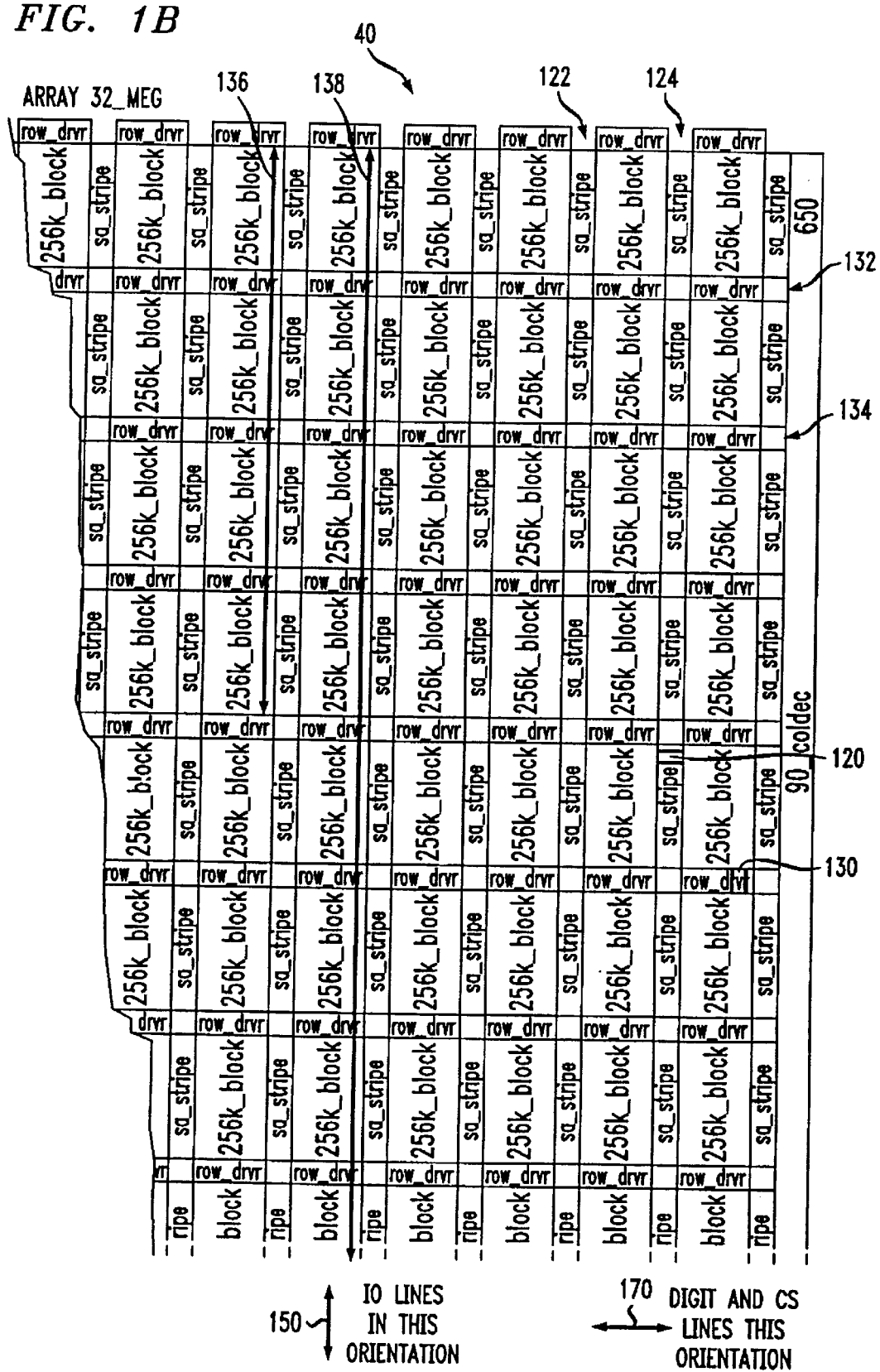
FIG. 1B shows a layout of a memory array of the present invention in plan view, including memory blocks, row driver strips, and sense amplifier strips.

Referring to first to FIG. 1A, a portion of a random access memory integrated circuit 90 is shown which includes a plurality of memory arrays 40, and peripheral circuitry 60. Each array has a span 42, and includes, as shown in FIG. 1B, memory blocks 110 separated from each other in a first direction by a plurality of sense amplifier's 120, and from each other in a second direction by a plurality of row drivers 130. Accordingly each memory block is bounded on two opposing sides by first and second sense amplifier stripes 122, 124 respectively. Further, each memory block is bounded on two other opposing sides by first and second row driver stripes 132, 134 respectively. The sense amplifier stripes each have a longitudinal axis in a first orientation 150 across the array while the row driver stripes each have a longitudinal axis in a second orientation 170 across the array, perpendicular to the first orientation 150. It should be noted that a trace within a layer may have a first portion with a longitudinal axis oriented in a first orientation 150, and a second portion with a longitudinal axis oriented in a second 170 orientation which is perpendicular to the first orientation 150. Also indicated are 4-block 136 and 8-block 138 spans of the memory array.

Figure 2:
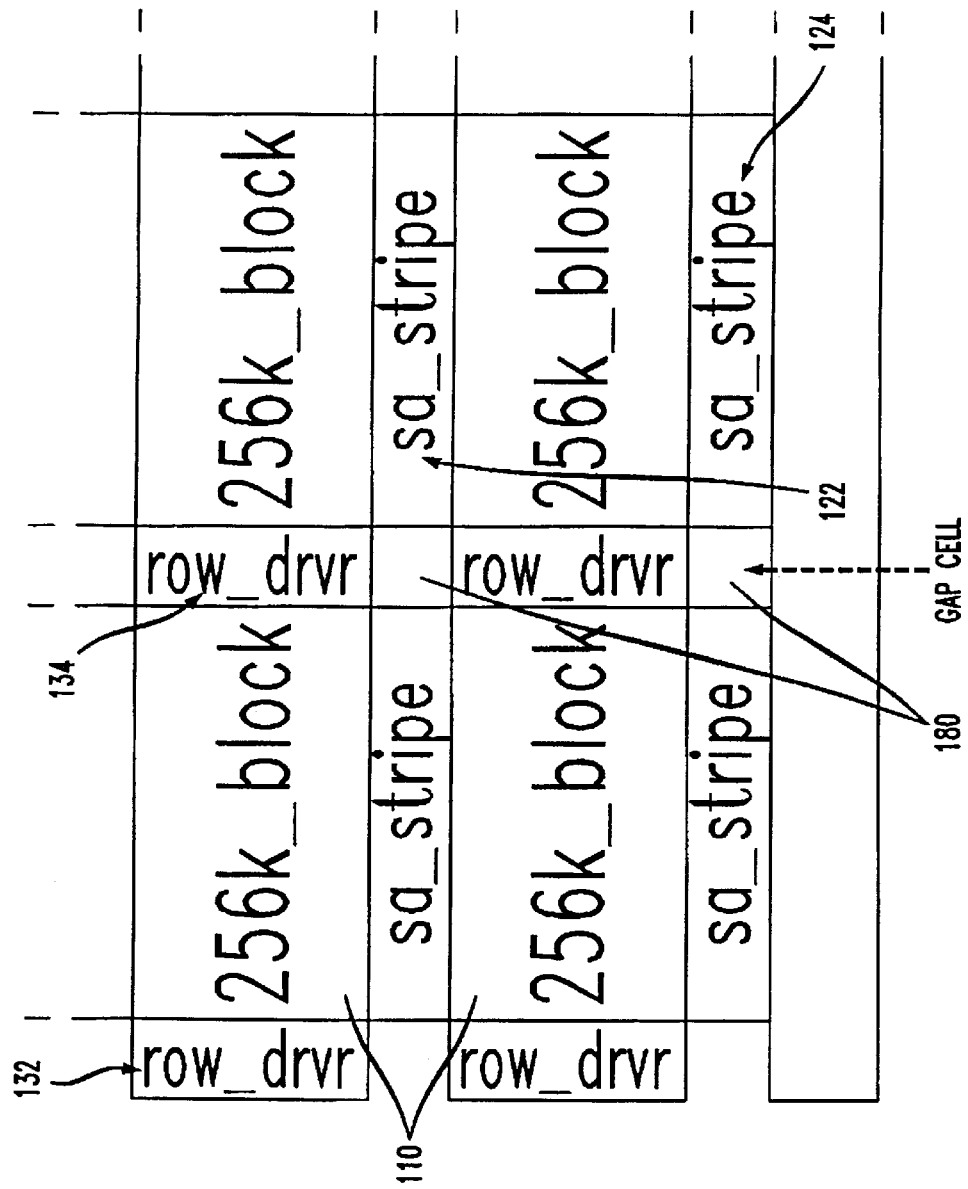
FIG. 2 shows an enlarged view of the relationship between memory blocks, row driver strips, and sense amplifier strips.

FIG. 2 is an enlarged view of a portion of the arrangement illustrated in FIG. 1B, including a plurality of memory blocks 110. In FIG. 2, a plurality of gap cell 180 regions are identified. Each gap cell 180 includes a portion of the integrated circuit at an intersection of a sense amplifier stripe 134 and a row driver stripe 122.

Figure 3A:
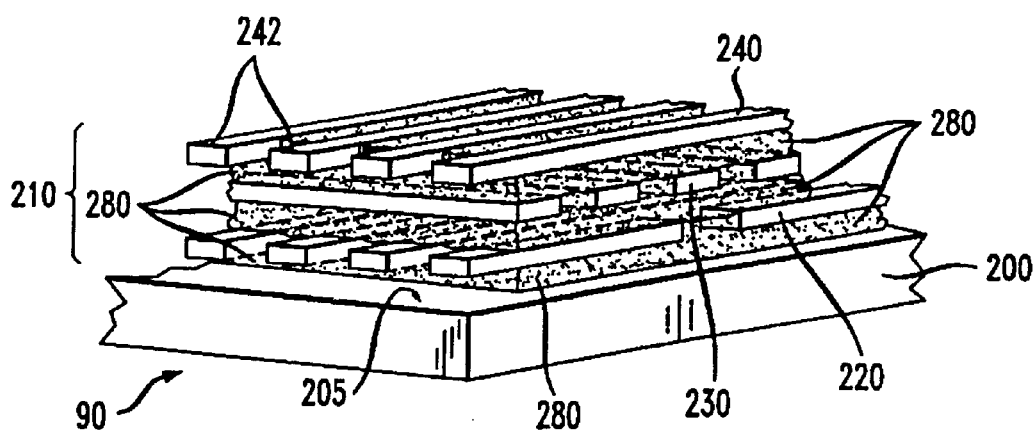
FIG. 3A shows, in perspective view, the relationship between a substrate assembly ly and three metalization layers of an integrated circuit memory device of the present invention.
Figure 3B:
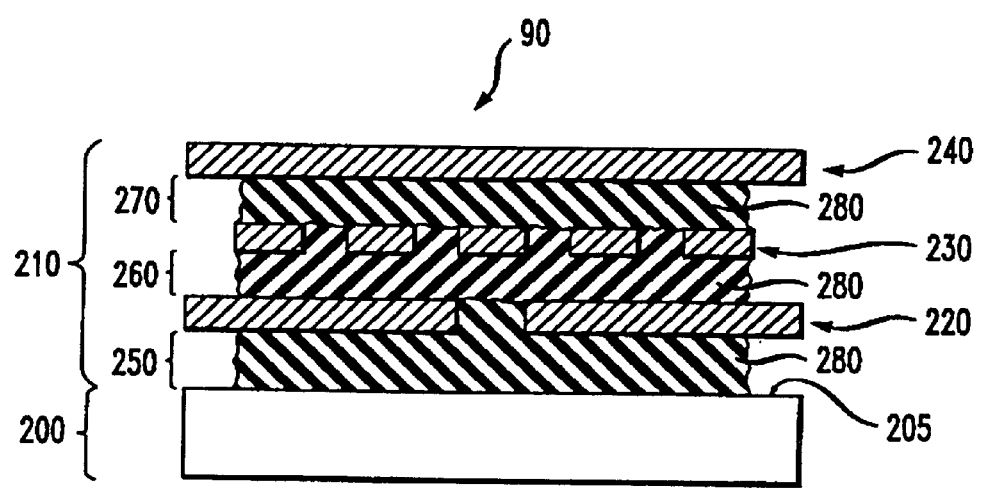
FIG. 3B shows, in a sectional elevated view, the relationship between a substrate assembly and three metalization layers of the present invention.

Referring to FIG. 3A, which shows a portion of the IC memory device in perspective view, and to FIG. 3B, which shows the same in an elevated sectional view, the integrated circuit 90 includes a substrate assembly 200 and a conductor portion 210. The conductor portion defines at least first 220, second 230, and third 240 layers of metalization. It should be noted that a layer of metalization includes a plurality of discrete traces 242 or conductors arranged in a pattern. Accordingly a first set of traces defines a metal-1 220 layer, a second set of traces defines a metal-2 230 layer, and a third set of traces defines a metal-3 240 layer.

In one aspect of the present invention, the use of buried polysilicon conductors as circuit traces is reduced in favor of three layers of metal traces 242 deposited on layers of insulation 280 disposed above a substrate assembly 200. In a particular embodiment, the present invention includes three layers of metal traces 220, 230, 240 disposed above, and substantially parallel to an upper surface 205 of a substrate assembly 200. The substrate assembly includes doped active regions, gate stacks, polysilicon plugs and a limited number of polysilicon lines. In addition, as known in the art capacitor structures are also fabricated in the memory array above the surface 205 of the substrate and below the three layers of metalization. By reducing the density of buried polysilicon, and replacing them with metal traces, the integrated circuit of the present invention reduces conductor resistance and capacitance, and thus increases the circuit's speed of signal response.

Figure 4A:
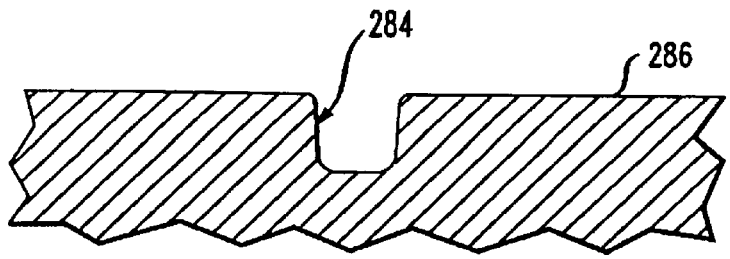
FIG. 4A shows a dielectric material including a grove adapted to undergo damascene metalization.
Figure 4B:
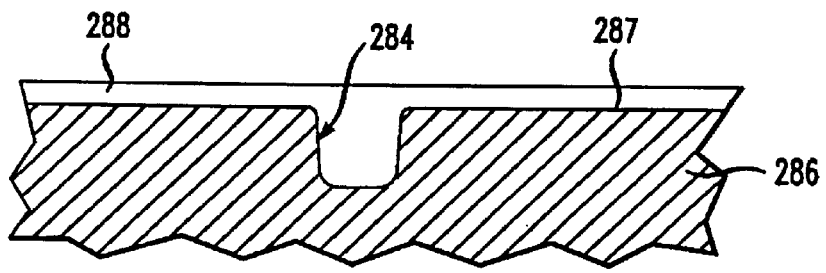
FIG. 4B shows a dielectric material and a metallic layer at an intermediate point in a damascene metalization process.
Figure 4C:
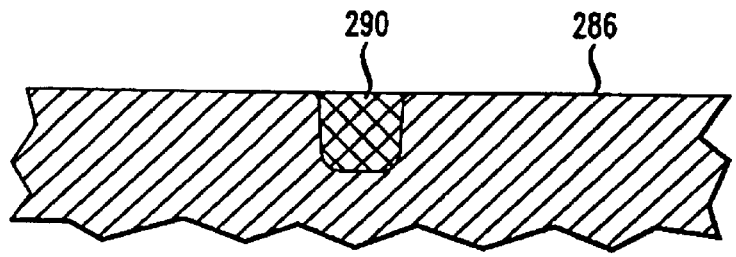
FIG. 4C shows a dielectric material and a metallic trace produced by damascene metalization.

The deposition of three layers of metal traces over a substrate assembly may be accomplished by use of a damascene process. The damascene process allows deposition of metal lines and interconnects in integrated circuit technology. In the damascene process as shown in FIG. 4A, a groove 284 is first formed, e.g., by etching, in a dielectric layer 286 such as a substrate assembly 200, or insulating layer 280. As shown in FIG. 4B, metal 288 or metallic material is deposited over a surface 287 of the dielectric 286, including into the groove 284. FIG. 4C shows that excess metal is then removed by chemical mechanical planarization (CMP) as is known in the art. Once the excess metal has been removed only the metal that was deposited down within the grooves 290 remains. This metal 290 forms an interconnecting trace. According to a preferred embodiment of the present invention, each of the three layers of traces may be formed using a damascene process.

Referring again to FIG. 3B, each metal layer is disposed in spaced relation to the other metal layers, and to the substrate assembly 200 of the integrated circuit 90 which contains fabricated devices. Interlayer insulating regions are defined between adjacent layers of metal, and between the metal-1 layer 220 and the substrate assembly 200 of the integrated circuit. Thus, a first interlayer region 250 is provided between metal-1 and a surface 205 of the substrate assembly 200 of the integrated circuit 90, a second interlayer region 260 is provided between metal-2 and metal-1, and a third interlayer region 270 is provided between metal-3 and metal-2. Electrically insulating material 280 is generally placed throughout the interlayer regions. As is understood in the art, one or more conventional materials may be used for this purpose.

Figure 5:
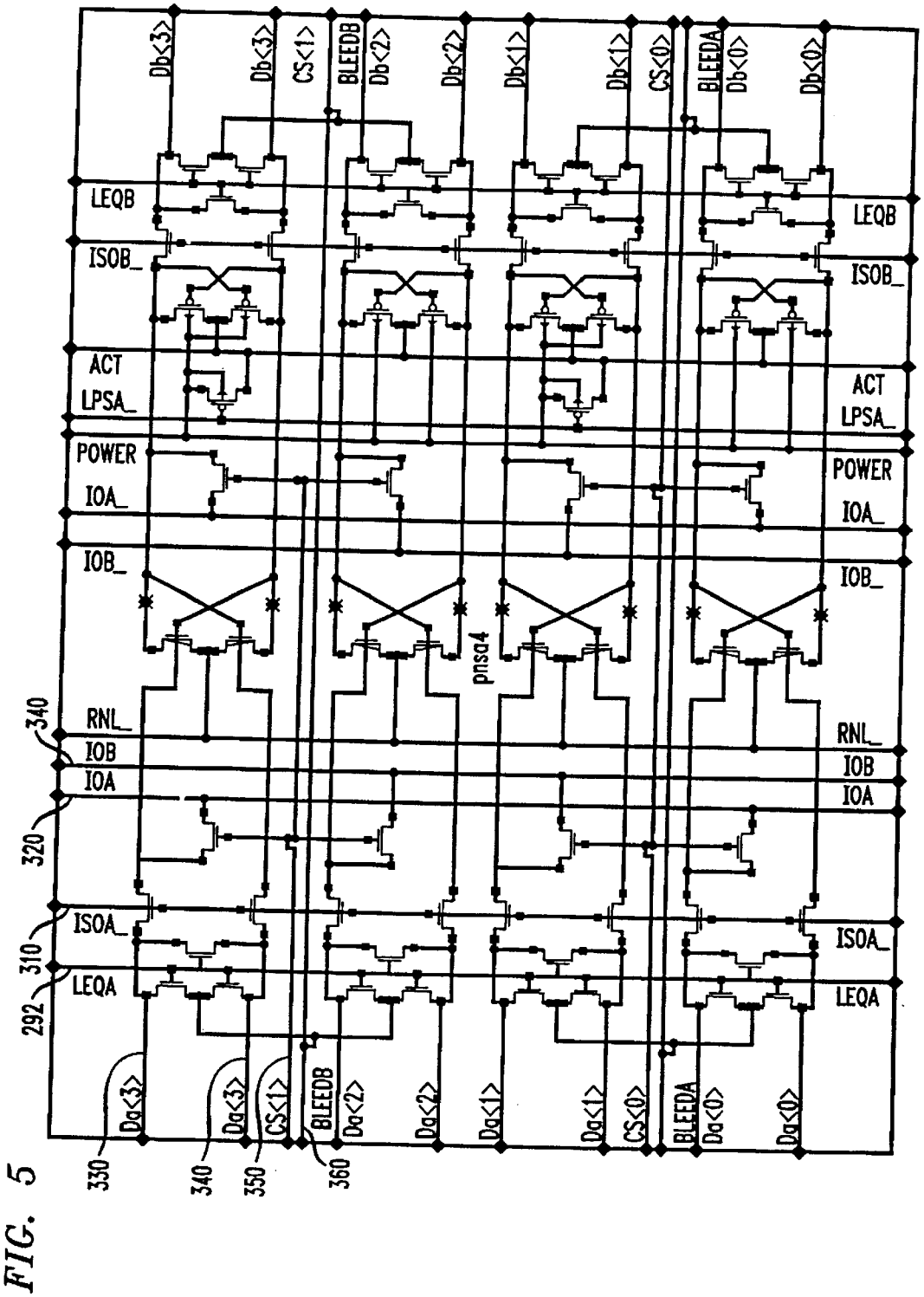
FIG. 5 shows an electrical schematic of a sense amplifier.
Figure 6:
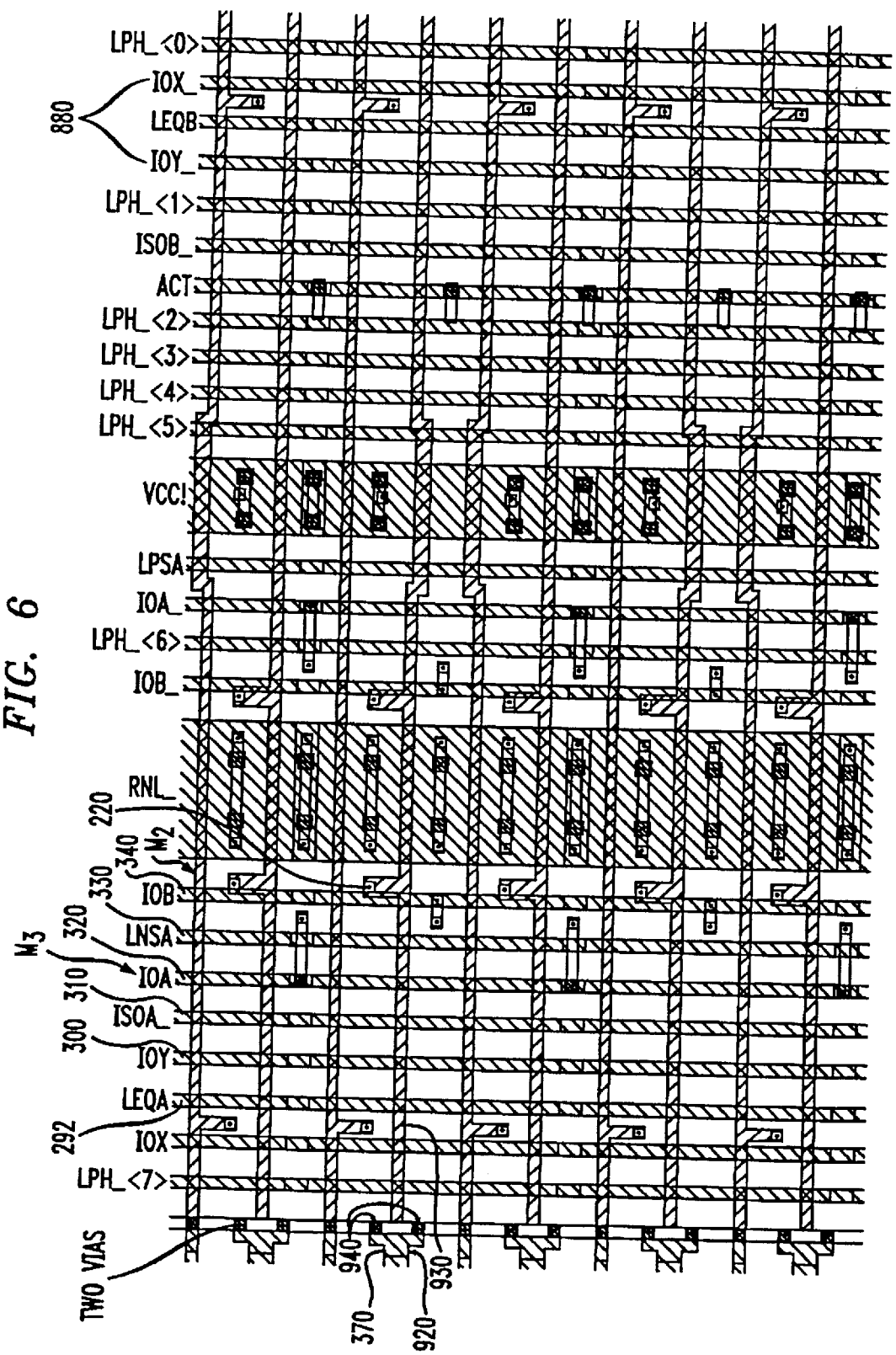
FIG. 6 shows a layout of metal-2, metal-3, and interconnecting vias, in the region of a sense amplifier.

The metal traces form conductors that electrically interconnect the active and passive devices of the integrated circuit. Examples of conductors provided in the traces of the metal-1, metal-2, and metal-3 layers are shown variously in electrical schematic form in FIG. 5, and in layout form in FIG. 6 and include, for example in metal-3, the LEQA 292 that conducts a signal to latch equalization of the digit lines, the IOY 300 line that conducts data across the integrated circuit, the ISOA_310 line that bears the signal calling for isolation of the digit lines prior to a data read, the IOA 320, a further I/O line, the LNSA 330 line that bears the signal to latch an N-sense amplifier, the IOB 340 line, a further I/O line, and a portion of a column select line CS 370.

According to the invention, various novel arrangements of traces within and between the metal layers metal-1, metal-2, metal-3 provide increased speed and storage density when compared with conventional arrangements.

Figure 7A:
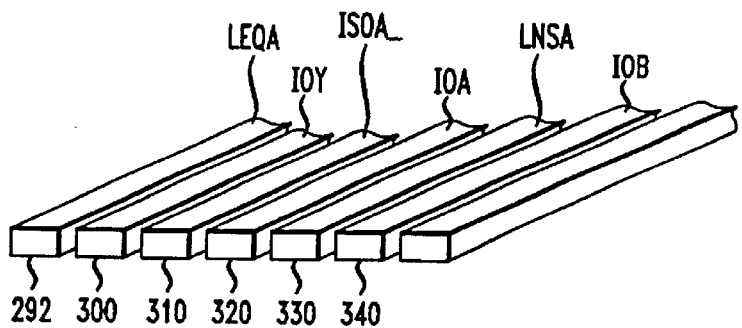
FIG. 7A shows the interleaved relationship of I/O lines and non-I/O lines in the metal-3 layer of the present invention.

In one aspect, the present invention includes a dynamic RAM integrated circuit having an arrangement of I/O lines wherein no two I/O traces are disposed adjacent to one another. Rather, at least one non-I/O (or control) trace is disposed between any two I/O lines. This is shown in FIG. 7A, wherein I/O lines IOY 300 and IOA 320 are separated by non-I/O line $ISOA_{13}$ 310. Similarly, I/O line IOA 320 is separated from IOB 340 by non-I/O line LNSA 330. This is further illustrated in layout form in FIG. 6.

Figure 7B:
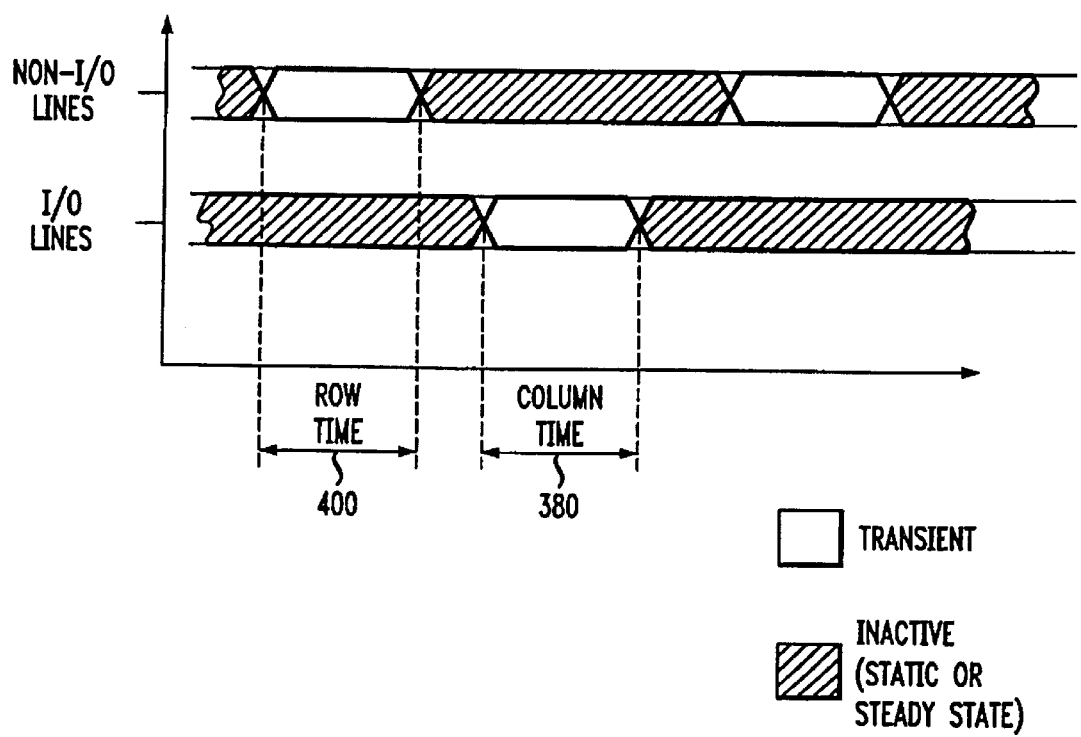
FIG. 7B shows, in graphical form, the tiring of some signal transitions on I/O lines and non-I/O lines of the present invention.

Internal or external circuit portions apply signals to the I/O lines, and to lines interspersed between I/O lines. The interspersed lines are arranged such that transitions of the applied signals during operation of the integrated circuit take place on the I/O lines (eg. 300, 320, 340) at different times than signal transitions on the interspersed control or non-I/O lines (eg. 292,310,330). Consequently at the time of signal transition on the I/O lines, the interspersed non-I/O lines appear to be static, and thus act to shield the I/O lines. Accordingly, interference between I/O 300, 320, 340 lines during I/O line transitions is reduced. Likewise, the I/O lines are stable during transitions of the interspersed control lines with the result that the I/O lines serve to shield non-I/O lines from transients present on other non-I/O 292, 310, 330 lines respectively. For example, non-I/O line 310 is shielded from transitions on non-I/O line 292 by I/O line 300. This signal phase relationship is shown graphically in FIG. 7B. Transitions of the I/O lines are shown to take place during a time period referred to as Column time 380 when the non-I/O lines are in an inactive (static or steady-state) condition. Conversely, when the non-I/O lines are in transient condition, referred to as Row time 400, I/O lines are static.

Figure 7C:
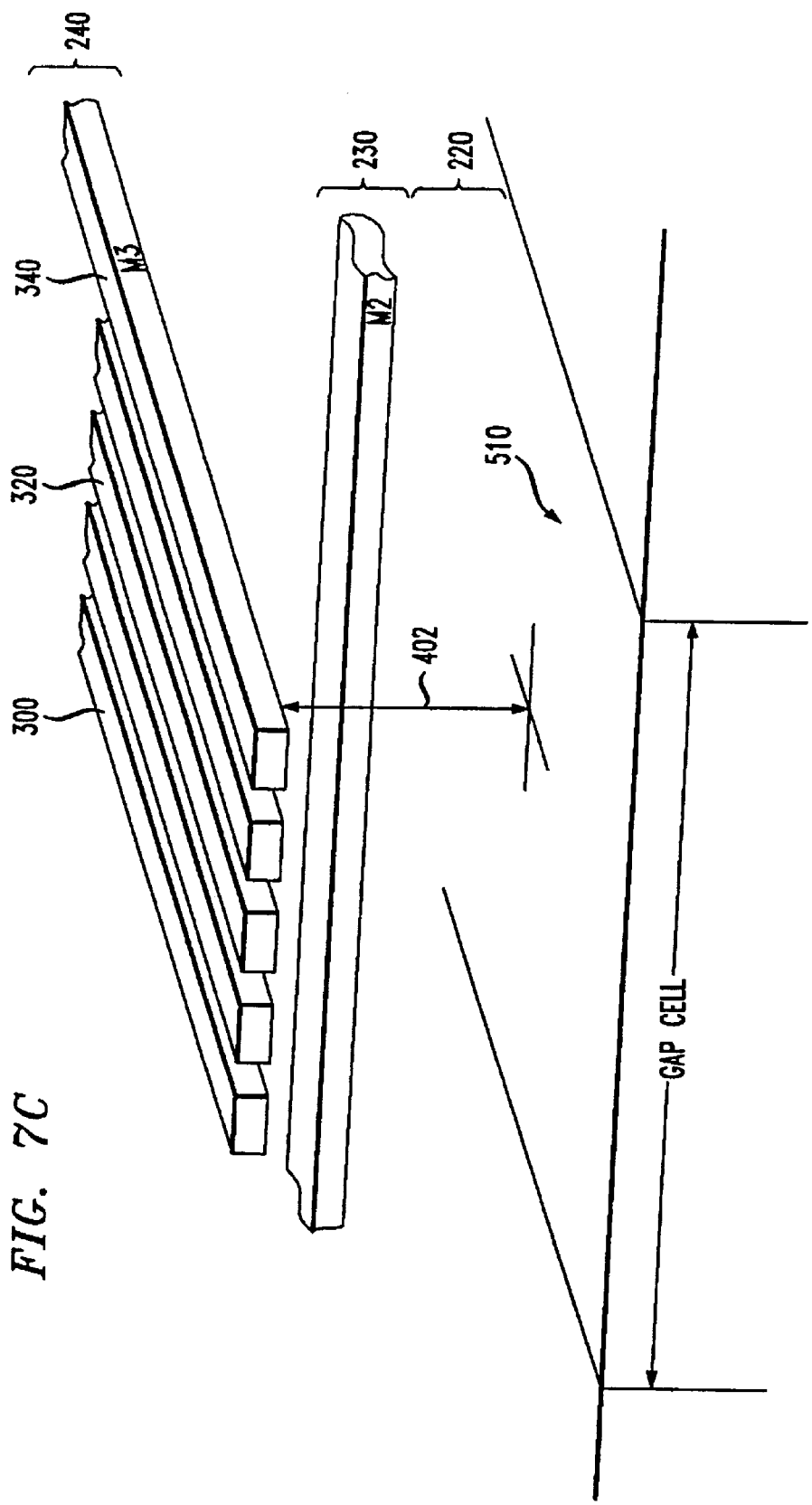
FIG. 7C shows an arrangement of I/O lines according to the invention.

Referring back to FIG. 1B, in a further aspect of the invention, I/O traces are disposed in the metal-3 240 layer across four block spans 136 and eight block spans 138 of a memory array 40. Each of these I/O traces forms a link at a single level across one of the above noted spans. Thus, a geometric connection may be made from one end of such a trace, along the trace, to the other end without leaving the metal-3 layer. The result is an available conduction path that is entirely disposed within metal-3, and that includes no vias, metal-2 portions, or metal-1 portions. Accordingly, as shown in FIG. 7C, a signal on one of the I/O lines eg. 300, 320, 340 does not encounter an intervening via, a metal-2 230, or a metal-1 220 implemented portion of an I/O trace.

Figure 7D:
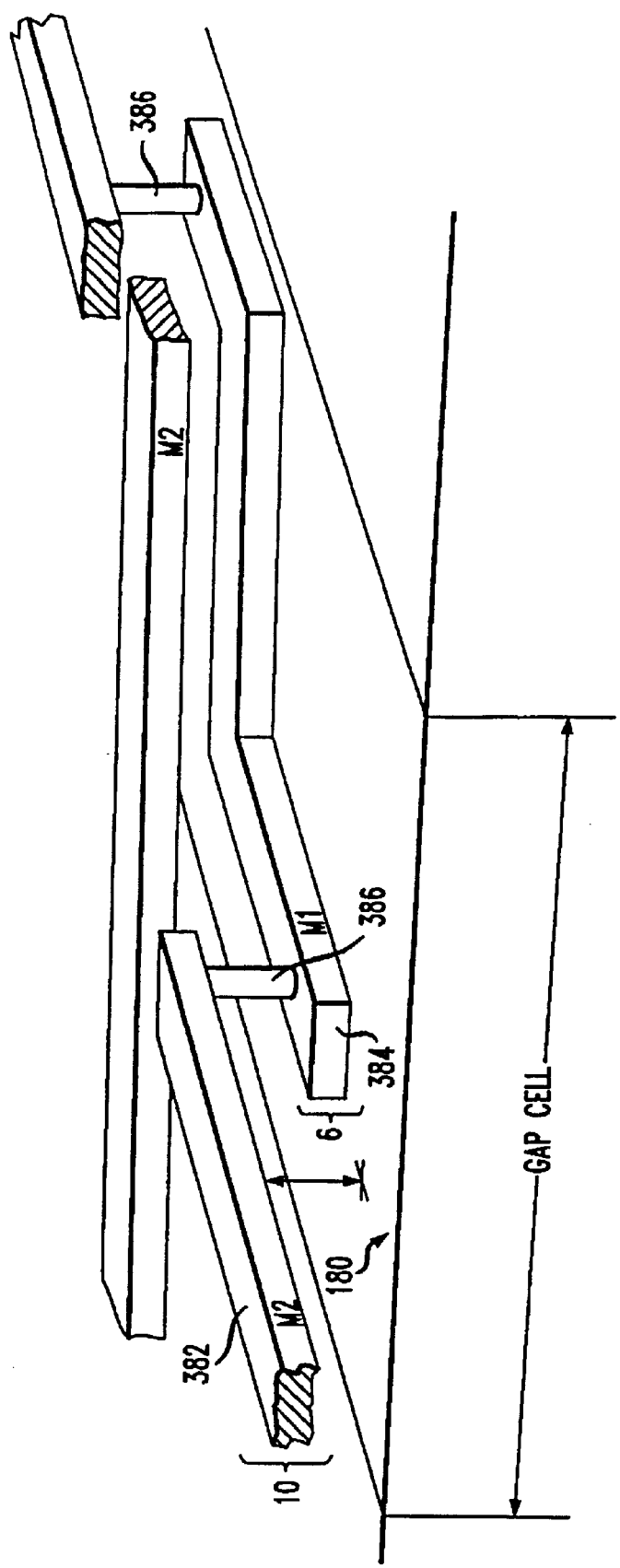
FIG. 7D shows a prior art arrangement of I/O lines in a gap cell region.

This contrasts with a prior-art implementation, as shown, for example, in FIG. 7D, in which a portion 382 of an I/O line is disposed in a metal-2 10 layer and another portion 384 of the same I/O line is disposed in metal-1 6 in the vicinity of a gap cell 180. Note that the metal-2 and metal-1 portions are connected by a via 386.

Referring again to FIG. 7C, the arrangement of I/O traces eg. 300, 320, 340 in substantially continuous fashion within the metal-3 layer 240 is particularly desirable since the third layer 240 of metalization is farther removed 402 from the substrate assembly surface 510 than the metal-1 220 or metal-2 230 layers. Providing greater distance 402 between a conductor and the underlying substrate assembly reduces the capacitance of the conductor, and thereby increases the speed of signal transmission on that trace. The reduction of the number of vias in the I/O conduction path tends to reduce the resistance of I/O lines eg. 300, 320, 340, since vias are generally more resistive than traces. Accordingly, the absence of vias further enhances signal transmission speed.

Figure 8A:
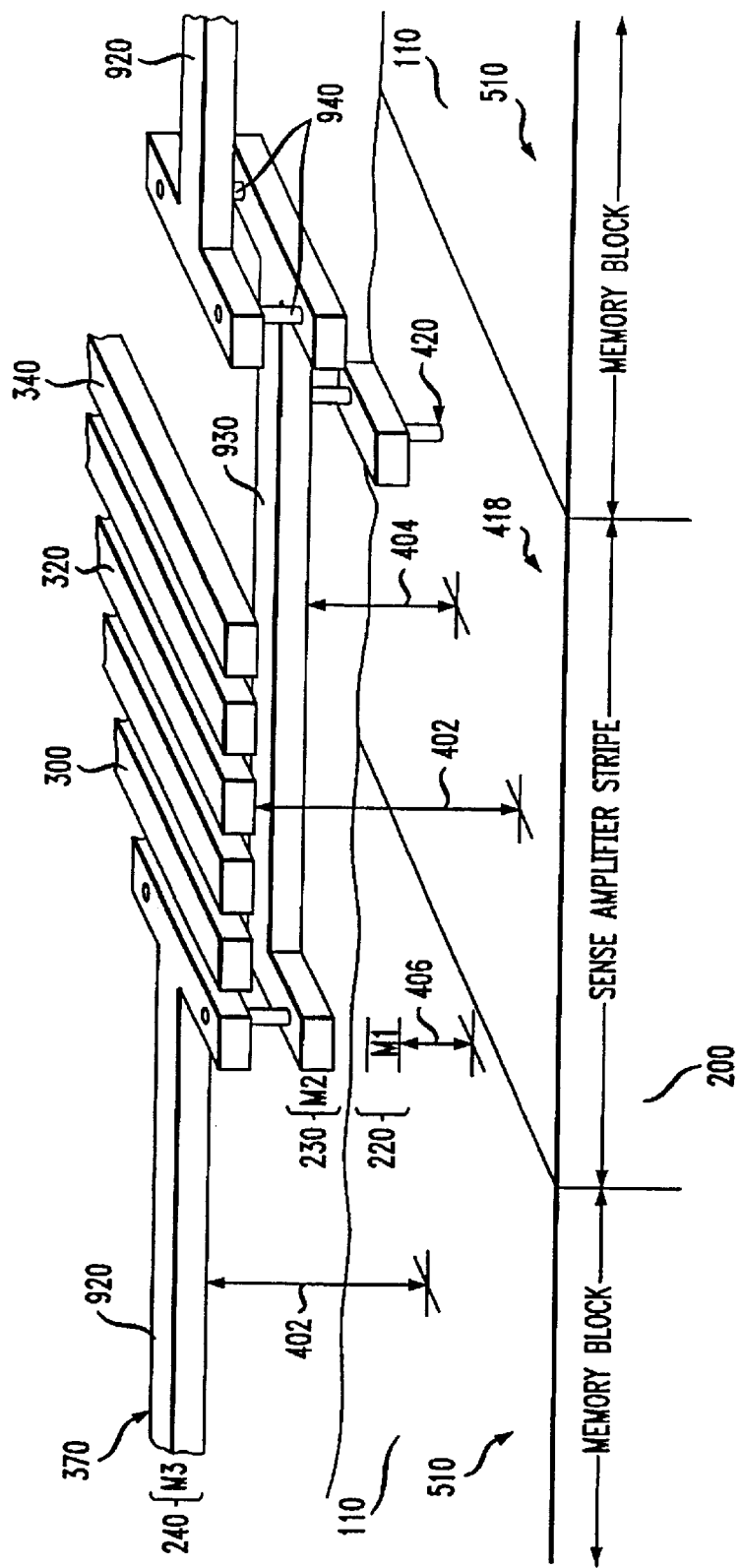
FIG. 8A shows the relationship between a column select line, and other various features of the present invention.
Figure 8B:
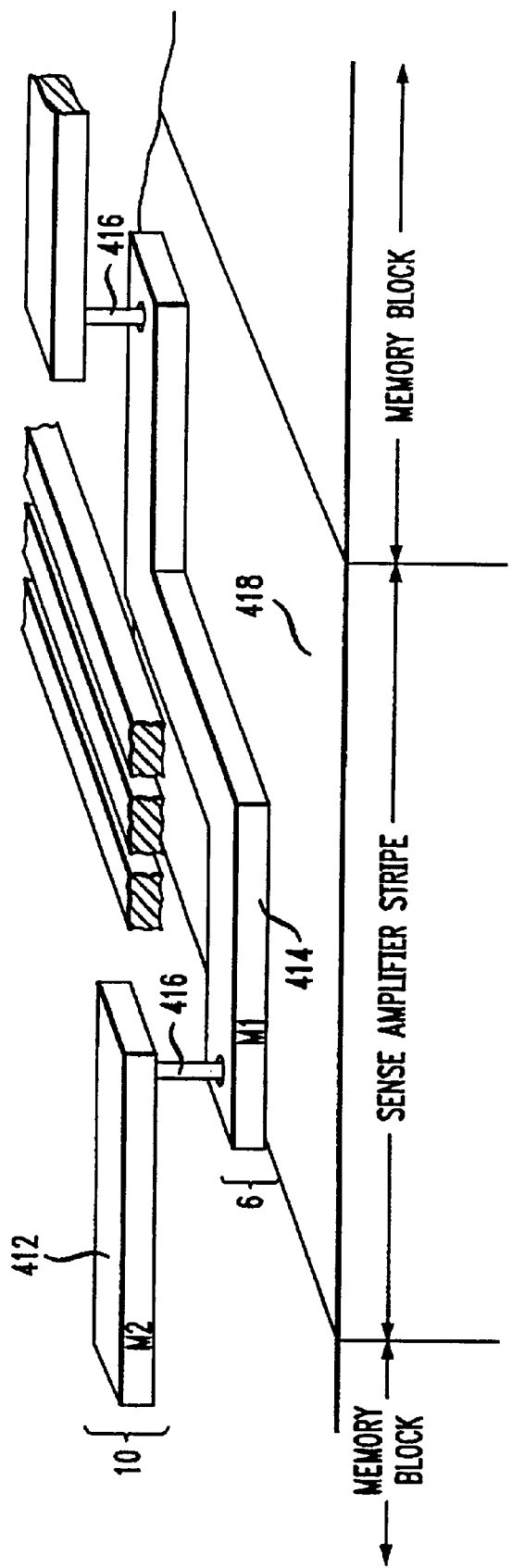
FIG. 8B shows a prior art embodiment of a column select line.

Referring to FIG. 8A, another aspect of the invention resides in the placement of a column select line 370 in metal-3 240 over a sense amplifier 418. In FIG. 8B, one sees that a conventional column select line 412, implemented in part in metal-2 10 is dropped to a portion 414 in prior art metal-1 6 in the vicinity of, and over, a sense amplifier 418. The column select line snakes through the sense amplifier region in metal-1, and then returns to metal-2. In order to accommodate the presence of the metal-1 portion 414 of this line, the sense amplifier 418 is conventionally laid out in asymmetrical fashion. Consequently there is a tendency for imbalance in a conventional sense amplifier. Referring again to FIG. 8A, the present invention locates I/O lines eg. 300, 320, 340 in metal-3 240 and the portion 930 of the column select line 370 over the sense amplifier 418 in metal-2 230. A connection 420 to the sense amplifier 418 may be made in any convenient fashion, as shown. The integrated circuit of the invention thereby avoids a conventional asymmetric sense amplifier design. Instead, the sense amplifier 418 of the present invention may be designed without consideration for the path of the I/O lines eg. 300, 320, 340. This allows the layout of components having active regions disposed within the substrate assembly arranged substantially symmetrically about a plane orthogonal to a top surface 510 of the substrate assembly.

The greater portion 920 of the column select line 370 is located in the metal-3 240 layer above a memory array block 110. This column select line is oriented orthogonally to I/O lines eg. 300, 320, 340. In the vicinity of a sense amplifier 418, a relatively short portion 930 of the column select line is implemented in metal-2 230. The metal-3 and metal-2 portions of the column select lines are connected with double vias 940, for reduced resistance. Referring back to FIG. 6, this arrangement is further visible where the metal-3 portion 370 and metal-2 portion 930 of an exemplary column select line, along with connecting vias 940, are labeled. According to this aspect of the invention, the integrity of I/O lines is maintained for fastest performance, while optimizing the column select line by maintaining most of its length in metal-3.

Figure 9:
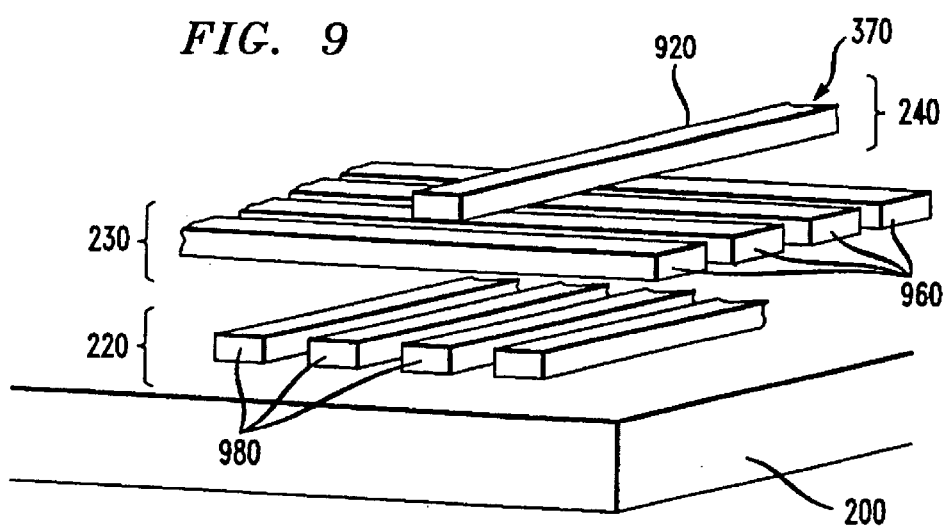
FIG. 9 shows the relationship between a column select line in metal-3, a digit line in metal-1, and various other conductors according to an embodiment of the present dimension.
Figure 10:
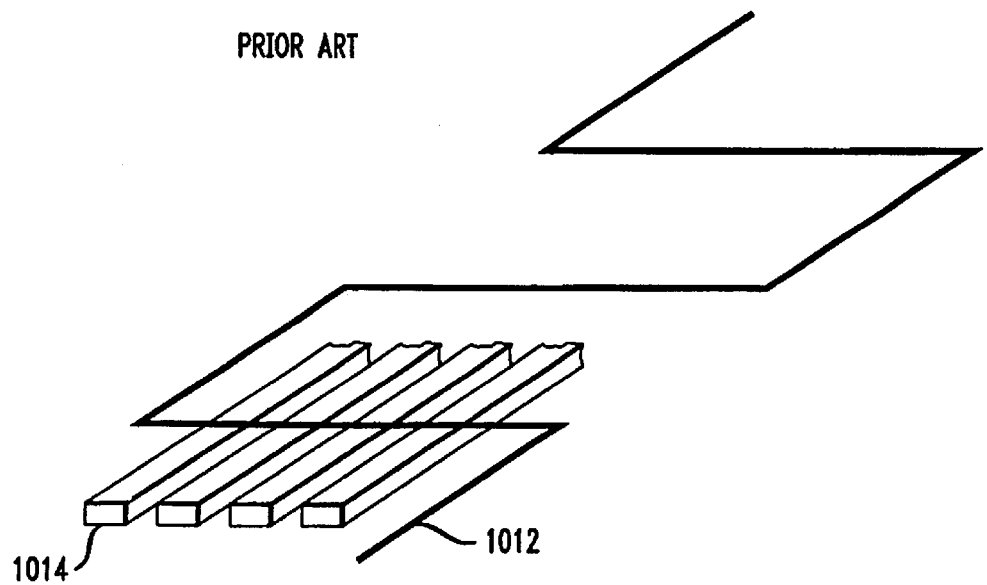
FIG. 10 shows a prior art layout of the relationship between a column select line and plurality of digit lines of the present invention.

A further aspect of the invention is shown in FIG. 9. A portion 920 of a column select line 370 is located in metal-3 240. A digit line 980 is disposed in metal-1 220 under, and substantially parallel to the column select line 920. A layer of other conductors 960 a disposed in metal-2 230 between the column select line 920 in metal-3 and digit line 980 in metal-1 220 and located substantially orthogonal to both the column select line 920 and the digit line 980. These other conductors act to shield the digit line from interference generated by signal transitions that take place on the column select line 920. This is important because the digit lines carry low-level signals that are subject to column select line interference. Implementing a column select line in metal-2, directly above and parallel to digit lines in metal-1 would substantially increase the likelihood of digit line imbalance. As shown in FIG. 10, imbalance in prior art digit lines 1014 is avoided by a different arrangement. A serpentine column select line 1012 that crosses all digit lines 1014 in substantially orthogonal fashion. This arrangement maintains substantially equal coupling between the column select line and each digit line, but is inefficient. In the present invention, as shown in FIG. 9, by placing column select lines 920 in metal-3 240, and providing an intervening layer of orthogonal traces 960, it becomes possible to run the column select line 920 linearly from point-to-point, without a serpentine layout, and without experiencing uneven digit line coupling. This results both in savings in real estate, and in more rapid signal transmission.

Figure 11A:
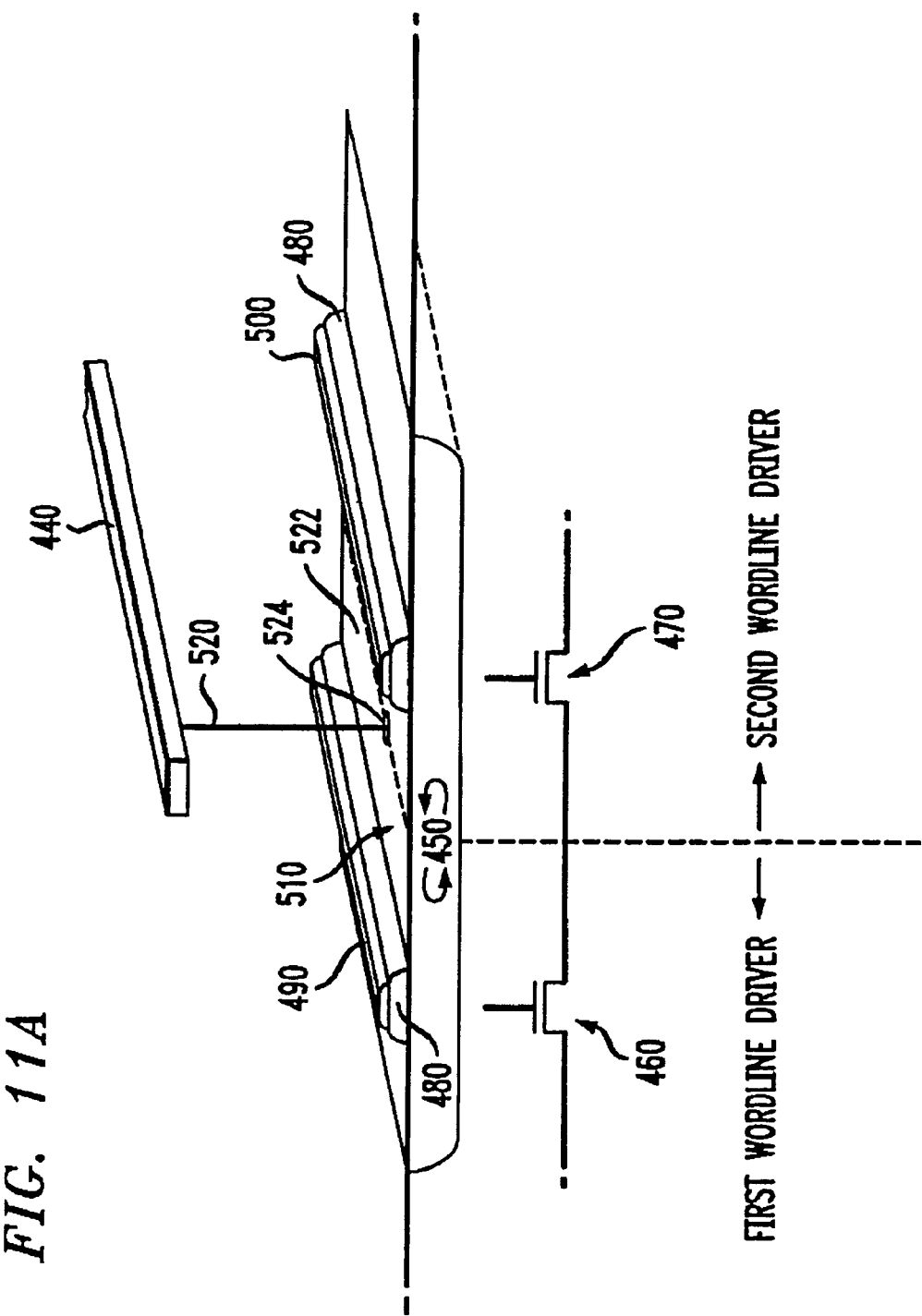
FIG. 11A shows an elevated sectional view of one embodiment of the shared-drain wordline driver transistor of the present invention.
Figure 11B:
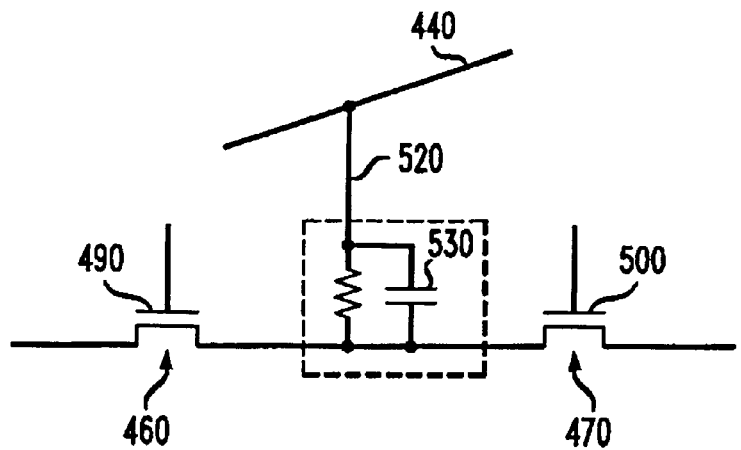
FIG. 11B shows electrical schematic representation of a resistor capacitor model of the electrical junction connecting a trace to the shared-drain of a wordline driver transistor.
Figure 11C:
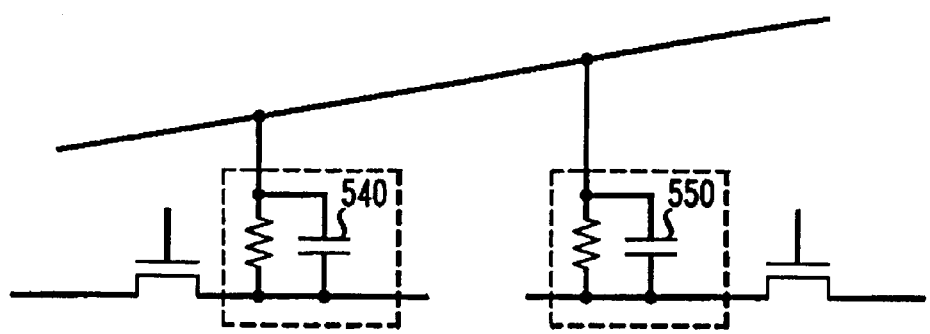
FIG. 11C shows electrical schematic including a prior art connection to two transistors without a shared drain connection.

In another aspect, the invention provides a dynamic RAM integrated circuit memory device having a wordline driver portion including a plurality of wordline drivers, a plurality of global phase lines, and a further plurality of local phase lines. Phase lines are lower address lines. Global phase lines are operatively connected to the low order latched address lines. A phase driver circuit is connected at its input ports to a plurality of global phase lines. The phase driver circuit decodes the global phase lines and is connected at its outputs to a plurality of local phase lines. This arrangement is illustrated on FIG. 14, below. According to the invention, two wordline driver circuits each include one of a pair of transistors. The paired transistors are configured such that first and second transistors, used in first and second wordline drivers respectively, share a single diffusion region connection with a phase line. This arrangement is illustrated in FIG. 11A which shows a phase line 440, and an active area 450 for first 460 and second 470 transistors. Gate insulating material 480 separates first 490 and second 500 gate conductors of the first and second transistors respectively from a surface 510 of a substrate, thereby forming first and second gate devices of the aforementioned first 460 and second 470 transistors respectively. A phase line 440 is connected to the surface 510 of the active region at a location between the first and second gate conductors by an intermediate conductor 520. This single connection forms an electrical connection between the phase line 440 and the sources or drains 522 of both the first 460 and second 470 transistors. The foregoing arrangement produces only a single junction capacitance at the connection 524 of conductor 520 to the two transistors. In contrast, forming the two transistors in separate active regions, with separate connections to the phase line, would result in loading the phase line 440 with two separate junction capacitances. Propagation of signals on the phase line would therefore tend to be slower, and additional current would be required to drive the line. FIGS. 11B and 11C illustrate schematically the difference between the arrangement of the invention and a conventional alternative, where the junction capacitance of the single 530 and double 540,550 connections between the phase line and wordline driver transistor are shown expressly. Note that although illustrated using insulated gate field-effect transistors, the advantages disclosed would accrue for any of a wide variety of transistors.

Figure 12A:
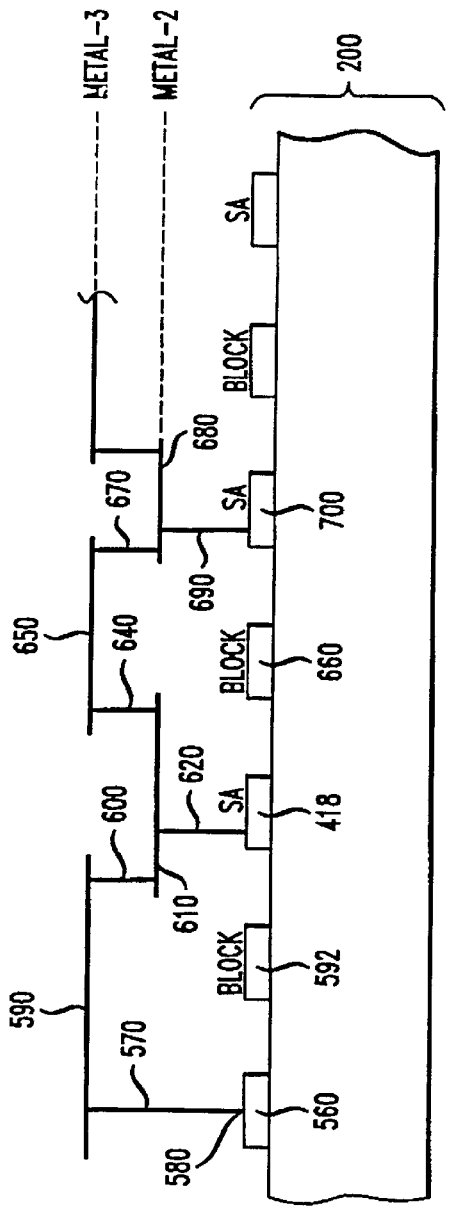
FIG. 12A shows the relationship between a global bleeder line, a global bleeder circuit, and other features of the present invention.

In another aspect of the invention, a single bleeder circuit is shared among a plurality of sense amplifier circuits. This presents an advantage in a dynamic RAM integrated circuit in which digit lines are run in a metal-1 layer, rather than in polysilicon on the substrate assembly 200, as in conventional structures. Where digit lines are run in metal-1, there is an opportunity for row to column shorting. Such shorting, when it takes place, causes a standby current to flow in the transistors of the sense amplifier. To eliminate standby current, standby voltage is fed from a bleeder device through a bleeder line to a sense amplifier. The bleeder device is a current limiter, as is known in the art, that supplies the bleeder voltage. In previous technology, one bleeder device was provided for each sense amplifier. In an exemplary embodiment of the present invention, one bleeder device may be used to feed as many as seventeen sense amplifiers, or more, through a global bleeder line. In an integrated circuit with at least three layers of metalization, a global bleeder line can be run across an array in metal-3, parallel to a column select line. FIG. 12A illustrates this aspect of the invention. As shown, a bleeder device 560 is implemented in the substrate assembly 200 of the integrated circuit. A conductor 570 connects an output 580 of the bleeder device to a first portion of a global bleeder line 590 disposed in the metal-3 layer. The first portion of the global bleeder line 590 traverses a first memory block 592. In the vicinity of a first sense amplifier 418, the global bleeder line 590 is connected by a first conductor 600, to a first end of a local bleeder line 610 implemented in metal-2. From the local bleeder line 610, electrical connection is made by a second conductor 620 to a first sense amplifier 418. A second end of the local bleeder line 610 is connected by another conductor 640 to a further portion 650 of the global bleeder line. This further portion 650 of the global bleeder line, disposed in metal-3, traverses a second memory array block 660 and supplies bleeder voltage by a still further conductor 670 to another local bleeder line 680. This local bleeder line 680, in turn supplies a conductor 690 which conveys the bleeder voltage to a second sense amplifier 700. By repetition of the foregoing pattern a global bleeder line, including the portions noted, may convey a bleeder voltage across an array to a plurality of sense amplifiers. In this manner a single bleeder device replaces several bleeder devices previously required, one for each sense amplifier.

Figure 12B:
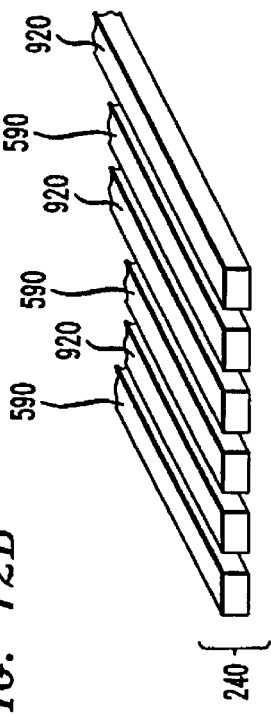
FIG. 12B shows the interspersed arrangement of bleeder line and column select line portions in metal-3.

In an additional aspect of the invention, as shown in FIG. 12B, the portions of bleeder lines (e.g. 590) disposed in the third layer of metalization 240 are arranged in alternating fashion with parallel portions 920 of the column select lines 370 that also reside in the third layer of metalization. As with the alternating arrangement of I/O and non-I/O lines discussed above, this arrangement of bleeder line and column select lines acts to prevent interference between column select lines.

The bleeder lines are maintained at a substantially constant voltage of Vcc/2. Accordingly, when the column select lines are transient the stable interspersed bleeder lines act to shield the column selects from capactive coupling and associated signal interference.

Figure 13:
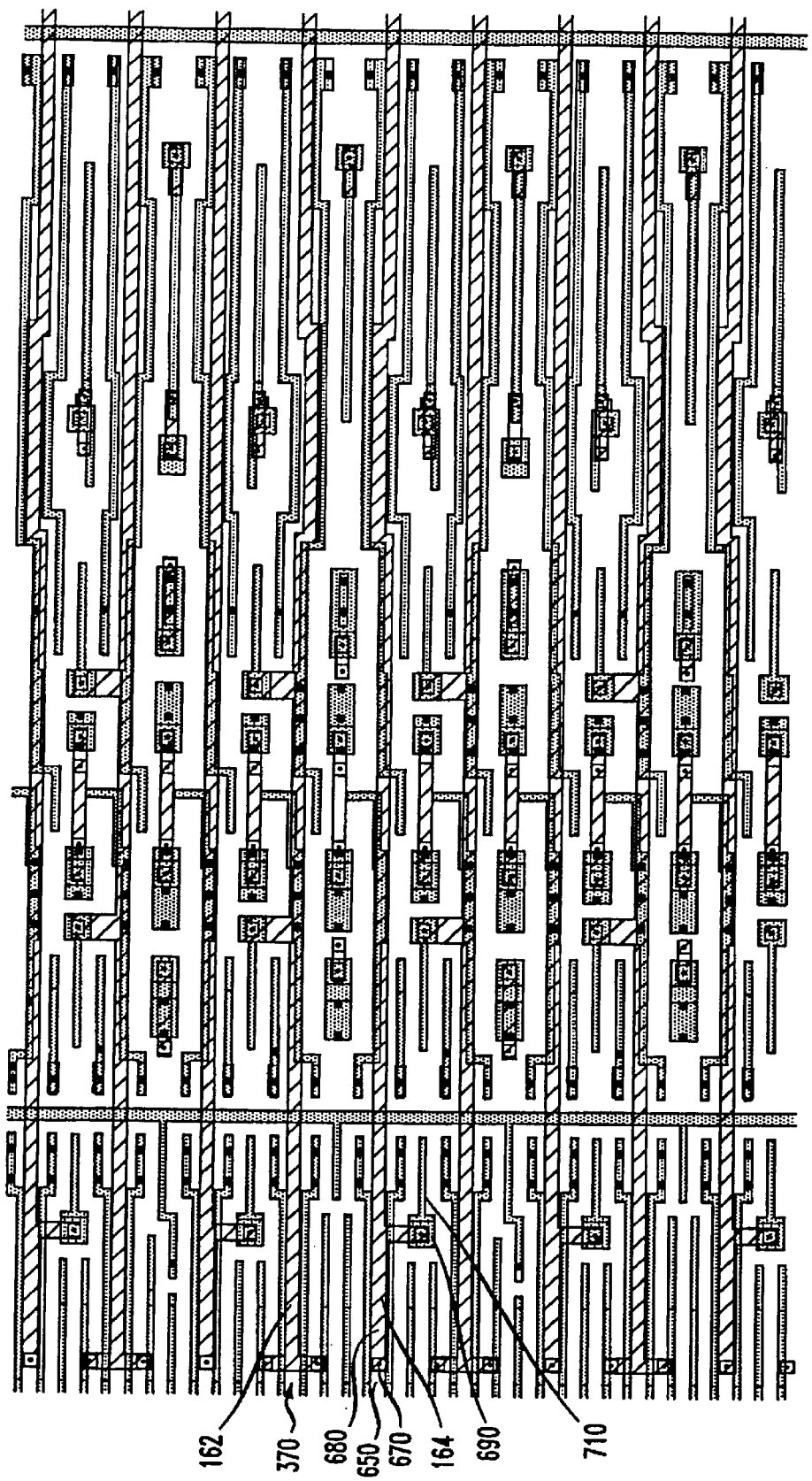
FIG. 13 shows a layout of metal-1, metal-2, and interconnecting vias in the region of a sense amplifier of the present invention.

FIG. 13 provides an illustration of a further aspect of this portion of the invention including an additional short conductor 710. A portion 650 of a global bleeder line, a local bleeder line 680, and a conductive via 670 connecting the two are shown. Also shown is another conductive via 690 connecting the local bleeder line 680 to the short conductor 710. This short conductor 710 is implemented in metal-1, in one embodiment, and serves to conduct the bleeder voltage supplied by the bleeder device 560 to the sense amplifier.

Figure 14:
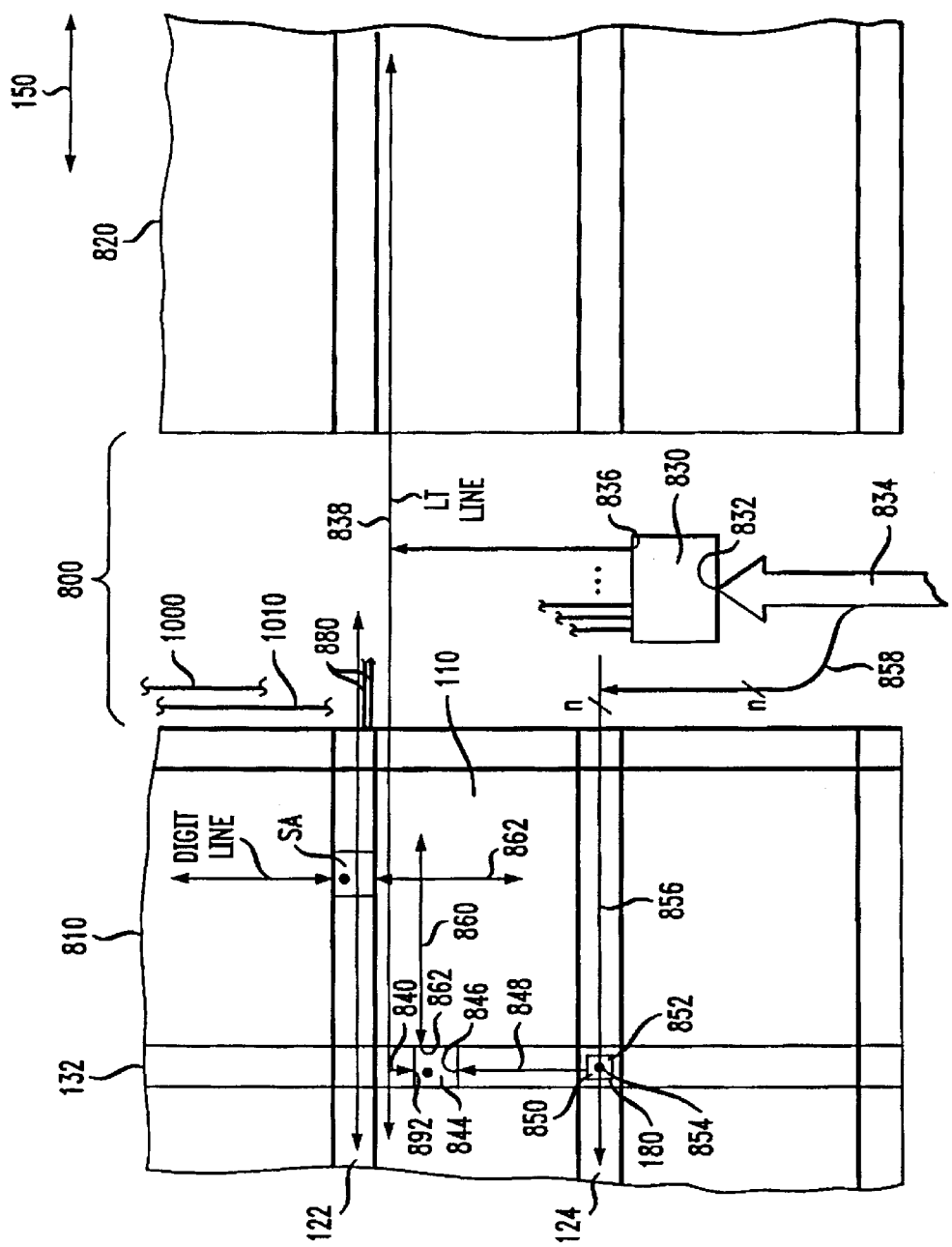
FIG. 14 shows the relative relationships between arrays, throat region, row decoder, local phase driver, and other aspects of the present invention.

In a further aspect, the invention includes a row decoder adapted to drive LT global wordlines, 838 shown on FIG. 14, of two memory arrays.

As shown in FIG. 14, a throat region 800 is defined as a region disposed between first 810 and second 820 memory arrays. Note that one memory array comprises a plurality of memory blocks) as shown in FIG. 1B. A row decoder 830 circuit portion of the integrated circuit resides in the throat region 800. The row decoder 830 includes a plurality of inputs 832 operatively connected to a respective plurality of latched address lines 834 and a plurality of outputs 836, each connected to a particular LT line 838. The global row decoder sets the state of each LT line 838 connected to one of its outputs 836, at a given time, depending on the latched address line states present on its inputs 832. A given LT line runs across the memory blocks 110 of an array in an orientation 150 parallel to the sense amplifier stripes 122. As is seen in FIG. 14, one LT line 838 runs across the two arrays 810, 820 on either side of a throat region 800. Portions of the LT line are disposed in the metal-3 layer over the memory blocks of the array. Other portions of the LT line are disposed in metal-2 and metal-1 respectively. In the integrated circuit of the invention, a further connection 840 operatively connects the LT line 838 to an input 842 of a particular wordline driver circuit 844. A further input 846 of the wordline driver circuit 844 is operatively connected to a local phase line 848 that is in turn operatively connected to an output 850 of a local phase driver 852 located in a gap cell 180 of an array 810. The local phase line 848 is disposed above the wordline driver stripe 132, and has a longitudinal axis oriented 170 substantially parallel to the wordline driver stripe 132. A plurality of inputs 854 of the local phase driver 852 are operatively connected to a plurality of global phase lines 856 that run in an orientation 150 parallel to, above, and near an edge of, a sense amplifier stripe 122, 124. The global phase lines 856, in turn, are operatively connected to low order latched address lines 858. A local wordline 860 is operatively connected to an output 862 of the wordline driver 844. The local wordline 860 crosses the array block 110 in an orientation 150 parallel to the sense amplifier stripes 122, 124 This local wordline 860 is disposed in the metal-2 layer, and is substantially orthogonal to a digit line 862 that crosses the memory block 110 in an orientation 170 parallel to the wordline driver stripe 132. The digit line 862 in disposed in the metal-1 layer. As previously discussed, a plurality of I/O lines 880 (eg. 300, 320, 340) are disposed above the sense amplifier stripe 122 in the metal-3 layer, with a longitudinal axis oriented 150 substantially parallel to the sense amplifier stripe 122. The I/O traces eg. 300, 320, 340 cross column select (CS) lines in the vicinity of the sense amplifier stripe 122 as previously illustrated in FIG. 8A.

In a further aspect of the invention, the throat region 800 also includes data read 1000 and data write 1010 lines, implemented in metal-3. These traces have a longitudinal axis oriented parallel 170 to the wordline driver stripes 132.

Figure 15:
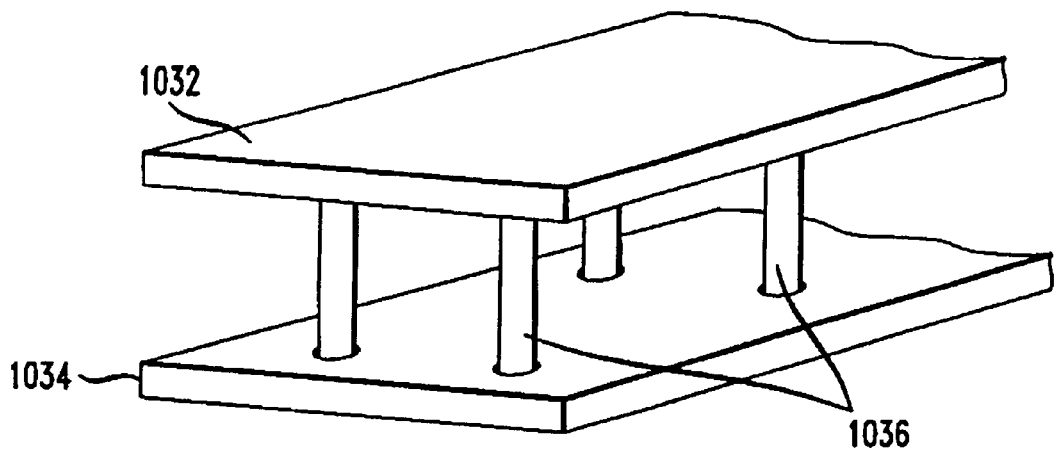
FIG. 15 shows a power bus sandwich including conductive traces and interconnecting vias of the present invention.

In a further aspect, the invention includes an arrangement for the busing of power and ground to the various devices of an integrated circuit wherein both power and ground connections are provided along substantially parallel routes in adjacent metal-2 and metal-3 layers. This arrangement is illustrated for power and ground in FIGS. 15 and 16 respectively. In FIG. 15, a first power conductor 1032 is implemented in metal-3 240 and a second power conductor 1034 is implemented in metal-2 230. These two power conductors are connected by a plurality of vias 1036 to reduce resistance and insure uniform voltage across the power plane.

Figure 16:
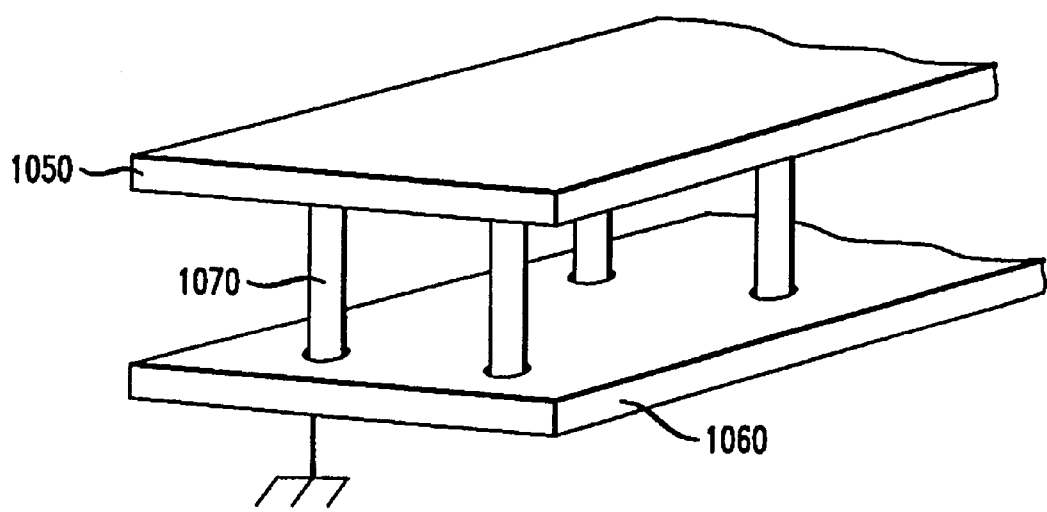
FIG. 16 shows a ground bus sandwich including conductive traces and interconnecting vias of the present invention.
Figure 17:
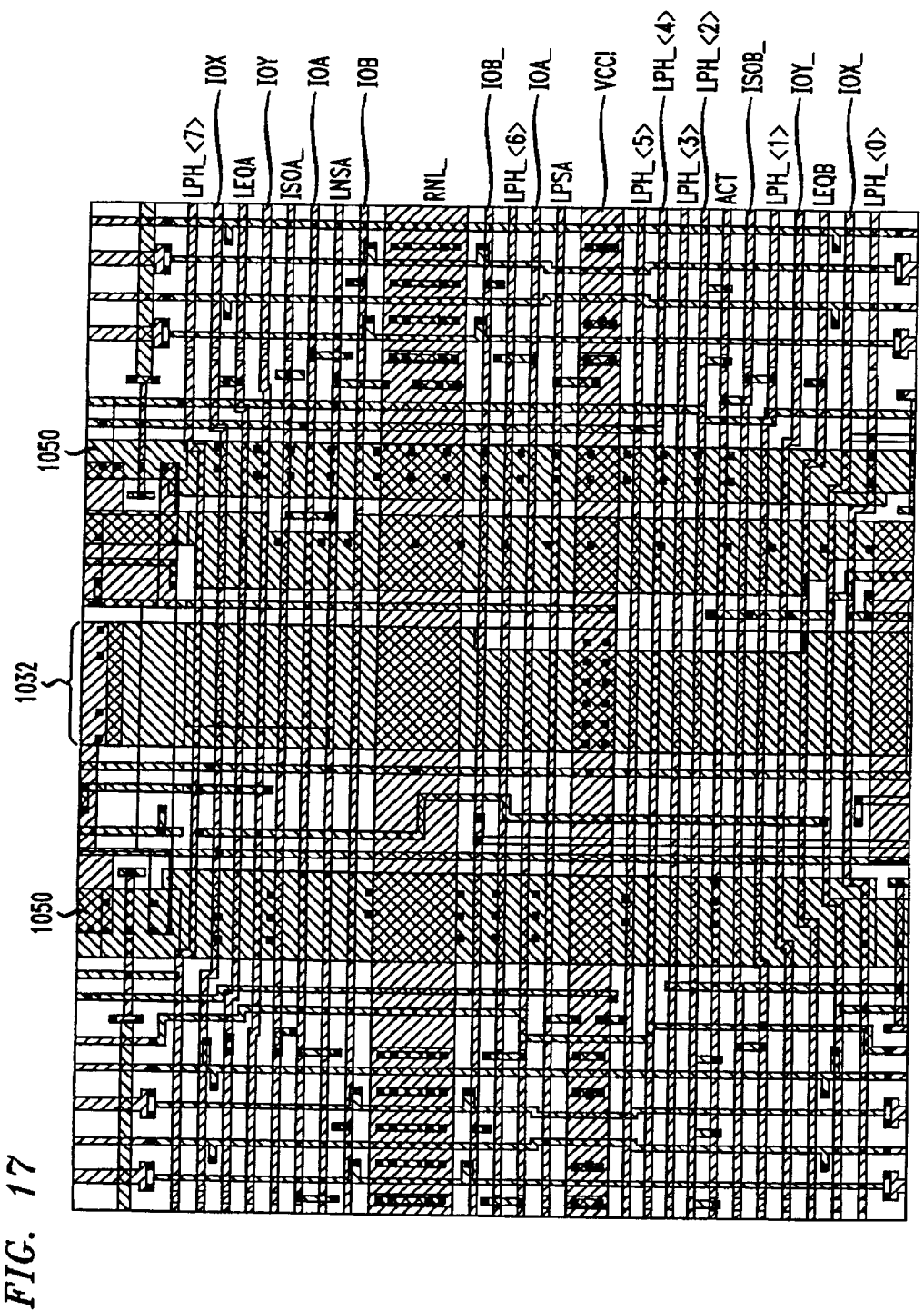
FIG. 17 shows a layout view of the metal-2, metal-3, and interconnecting vias in the vicinity of a gap cell of the present invention.
Figure 18:
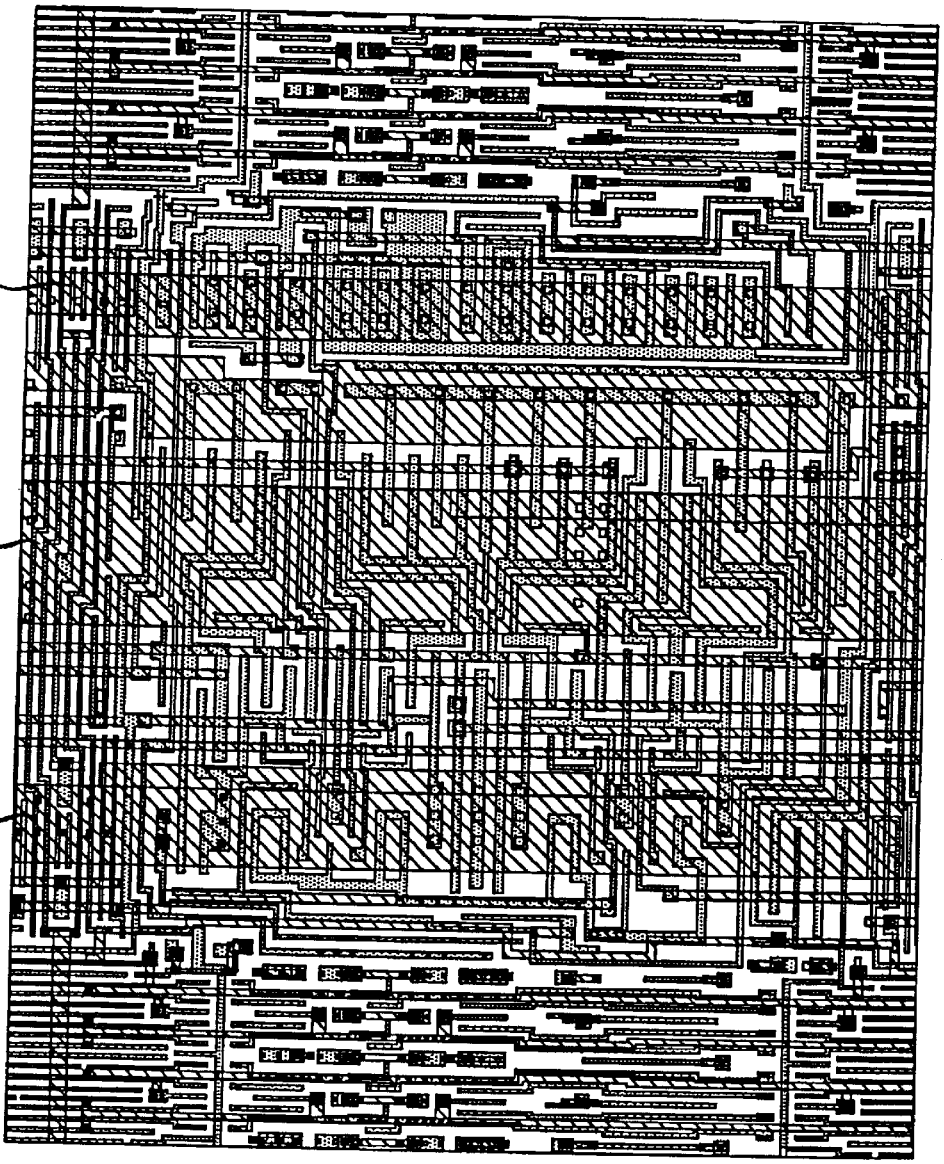
FIG. 18 shows a layout of the metal-1, metal-2, and interconnecting vias in the vicinity of a gap cell of the present invention.

In similar fashion, as shown in FIG. 16, first 1050 and second 1060 ground conductors are implemented in metal-3 240 and metal-2 230 respectively. Again, a plurality of vias 1070 connect the two ground planes. Both power 1032 and ground 1050 traces implemented in metal-3 are shown in plan view in FIG. 17. Power 1034 and ground 1060 traces implemented in metal-2 are shown in plan view in FIG. 18.

Figure 19:
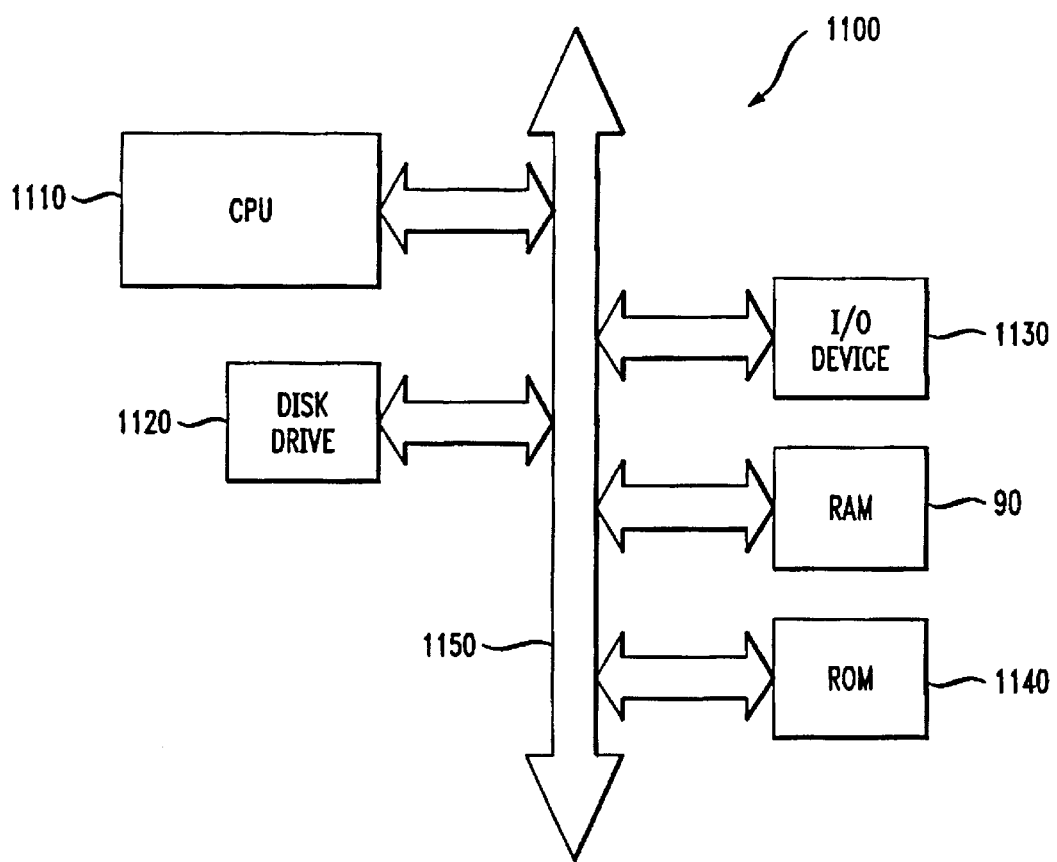
FIG. 19 shows a processor-based system utilizing a memory integrated circuit constructed in accordance with the present invention.

FIG. 19 is a block diagram of an exemplary processor-based system 1100 utilizing a memory integrated circuit 90 constructed in accordance with various aspects of the present invention. The system includes a Central Processing Unit (CPU) 1110, a disk drive 1120, an input/output (I/O) device 1130, and a Read Only Memory (ROM) device 1140. Also included is an address bus 1150 operatively connecting each of the foregoing components. The address bus 1150 is operatively connected to the latched address lines 834 of the memory integrated circuit 90, and conducts address signals from the CPU 1110 to the memory integrated circuit.

While there have been shown and described the fundamental and novel features of the invention as applied to a preferred embodiment, it will be understood that various substitutions and changes in the form and details of the device illustrated, and in its operation, may be made by those of skill in the art without departing from the spirit of the invention. It is our intention, therefore, to be limited only as indicated by the following claims.

What is claimed as new and desired to be protected by Letters Patent of the United States is:

1. An integrated circuit memory device comprising:
   a substrate assembly;
   first, second, and third layers of metalization, each layer disposed in substantially parallel spaced relation over said substrate assembly and each including a plurality of traces;
   a first plurality of I/O traces and a second plurality of non-I/O traces disposed among said traces of one of said layers, at least one non-I/O trace being disposed between two of said I/O traces.

2. A device as in claim 1 wherein said I/O traces and non-I/O traces are further arranged such that at least one I/O trace is disposed between two non-I/O traces.

3. An integrated circuit memory device comprising:
   a substrate assembly;
   first, second, and third layers of metalization, each layer disposed in substantially parallel spaced relation over said substrate assembly and each including a plurality of traces;
   a first plurality of I/O traces and a second plurality of non-I/O traces disposed among said traces of one of said layers, at least one non-I/O trace being disposed between two of said I/O traces;
   first and second circuit portions, said first circuit portion operatively connected to one of said I/O lines, said second circuit portion operatively connected to one of said non-I/O lines;
   said first and second circuit portions adapted to apply first and a second signals to said I/O line and said non-I/O line respectively, such that said first signal transitions at a first time and said second signal transitions at a second, later, time, said first and second times staggered so as not to overlap.

4. An integrated circuit memory device comprising:
   a substrate assembly;
   at least first, second, and third layers of metallic traces disposed in substantially parallel spaced relation over said substrate assembly, wherein said third layer of metallic traces includes a plurality of I/O traces and a portion of a column select line;
   said substrate assembly including a phase driver circuit within a gap cell region thereof.

5. An integrated circuit memory device comprising:
   a substrate assembly; at least first, second, and third layers of metallic traces disposed in substantially parallel spaced relation over said substrate assembly, wherein said third layer of metallic traces includes a plurality of I/O traces and a portion of a column select line;
   a further portion of said column select line disposed in said second layer of traces in proximity to, and substantially orthogonal to, each of said I/O traces.

6. A device as in claim 5 wherein said substrate assembly further comprises a phase driver circuit within a gap cell region thereof.

7. An integrated circuit memory device comprising:
   a substrate assembly;
   at least first, second, and third layers of metallic traces disposed in substantially parallel spaced relation over said substrate assembly, wherein said third layer of metallic traces includes a plurality of I/O traces and a portion of a column select line;
   a plurality of digit traces disposed among said first layer of metallic traces; said digit traces being in proximity to and substantially parallel to said portion of a column select line;
   a further plurality of traces disposed among said second layer of traces; each trace of said further plurality of traces having a portion disposed in proximity to and substantially orthogonal to each digit line of said plurality of digit lines and to said column select line.

8. A device as in claim 7 wherein said substrate assembly further comprises a phase driver circuit within a gap cell region thereof.

9. An integrated circuit memory device comprising:
   a substrate assembly;
   at least first, second, and third layers of metallic traces disposed in substantially parallel spaced relation over said substrate assembly, wherein said third layer of metallic traces includes a plurality of I/O traces and a portion of a column select line;
   first and second memory arrays disposed within said substrate assembly and coupled to said I/O traces and portion of said column select line;
   said memory arrays in spaced relation to one another and defining a throat region of said substrate assembly therebetween; and
   a row decoder circuit disposed within said throat region.

10. A device as in claim 9 wherein said memory integrated circuit further comprises:

at least one global wordline trace having a first portion disposed among said third layer of traces above said first memory array and a second portion disposed among said third layer of traces above said second memory array, said global wordline trace operatively connected to said row decoder.

11. An integrated circuit memory device comprising:

a substrate assembly;

at least first, second, and third layers of metallic traces disposed in substantially parallel spaced relation over said substrate assembly;

a first portion of a power bus trace disposed among said third layer of traces;

a second portion of a power bus trace disposed among said second layer of traces, said second portion disposed in proximity to and substantially parallel to said first portion; and a plurality of vias operatively connected between said first and second portions so as to provide an electrical connection therebetween.

12. An integrated circuit memory device comprising:

a substrate assembly;

at least first, second, and third layers of metallic traces disposed in substantially parallel spaced relation over said substrate assembly;

a first portion of a ground bus trace disposed among said third layer of traces;

a second portion of a ground bus trace disposed among said second layer of traces, said second portion disposed in proximity to and substantially parallel to said first portion; and a plurality of vias operatively connected between said first and second portions so as to provide an electrical connection therebetween.

13. An integrated circuit memory device comprising:

a substrate assembly;

at least first, second, and third layers of metallic traces disposed in substantially parallel spaced relation over said substrate assembly;

a sense amplifier stripe having a longitudinal axis in a first direction; a wordline driver stripe having a longitudinal axis in a second direction; and a metallic trace disposed among said second layer of traces having a first portion with a longitudinal axis disposed parallel to said first direction and a second portion having a longitudinal axis disposed parallel to said second direction.

14. An integrated circuit memory device comprising:

a substrate assembly;

first, second, and third layers of metalization disposed in spaced relation over said substrate assembly, said first second and third layers arranged in proximal, intermediate, and distal relationship to said subassembly respectively;

a sense amplifier portion including a plurality of components having active regions disposed within said substrate assembly arranged substantially symmetrically about a plane orthogonal to said subassembly; and said first layer being free of I/O traces in a region above said sense amplifier.

15. An integrated circuit memory device comprising:

a substrate assembly containing a plurality of electronic devices;

first second and third conductive layers, each layer including a plurality of conductive traces;

said conductive traces including a plurality of I/O lines disposed substantially within said third layer of said conductor portion;

said conductive traces including at least one column select trace; said column select trace including a first portion disposed within said third layer, and a second portion disposed within said second layer, said first and second column select trace portions connected to one another by at least one via;

said second portion of said column select trace disposed between said plurality of I/O lines and said substrate assembly.

16. An integrated circuit memory device comprising:

first, second, and third metalization layers provided over a substrate, each layer disposed in spaced relation to said substrate and to each other; said first second and third layers being arranged in proximal, intermediate, and distal relationship to said substrate respectively;

said third layer including a portion of a column select line;

said first layer including a digit line;

said digit line being substantially adjacent said column select line and substantially parallel thereto;

said second layer including a plurality of traces substantially orthogonal to an axis of said column select line and between said column select line and said digit line.

17. An integrated circuit memory device comprising:

a substrate assembly having circuit structures fabricated thereon;

first, second, and third layers of metalization disposed in spaced relation above said substrate assembly, said first, second, and third layers being arranged in proximal intermediate and distal relationship to said substrate assembly respectively;

a first power trace disposed within said third metal layer; a second substantially parallel power trace disposed within said second layer; and a plurality of vias disposed between and connecting said first and second traces to form a power bus.

18. A method of operating an integrated circuit as in claim 17, further comprising providing two additional layers of metalization, each closer to an underlying substrate than said I/O traces.

19. An integrated circuit memory device comprising:

a substrate assembly;

first, second, and third layers of metalization, each layer disposed in substantially parallel spaced relation over said substrate assembly and each including a plurality of traces; a first plurality of column select traces and a second plurality of bleeder traces disposed among said traces of one of said layers, at least one bleeder trace being disposed between two of said column select traces.

* * * * *

UNITED STATES PATENT AND TRADEMARK OFFICE
CERTIFICATE OF CORRECTION

PATENT NO. : 6,664,634 B2  Page 1 of 1
DATED : December 16, 2003
INVENTOR(S) : J. W. Thompson et al.

It is certified that error appears in the above-identified patent and that said Letters Patent is hereby corrected as shown below:

Column 3,
Line 51, delete "ly";

Column 4,
Line 4, change "tiring" to -- timing --;

Column 6,
Line 49, change "ISOA13" to -- ISOA_ --;

Column 8,
Line 17, change "a" to -- is --;

Column 10,
Line 61, change "880 (e.g. 300, 320, 340)" to -- e.g. 300, 320, 340 --; and Column 14,
Line 4, change "first second" to -- first, second --.

Signed and Sealed this

Sixteenth Day of March, 2004

JON W. DUDAS
*Acting Director of the United States Patent and Trademark Office*